US012796219B2

(12) United States Patent
Shang et al.

(10) Patent No.: US 12,796,219 B2
(45) Date of Patent: Nov. 10, 2026

(54) DISPLAY SUBSTRATE AND DISPLAY APPARATUS

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Tinghua Shang, Beijing (CN); Yi Zhang, Beijing (CN); Yang Zhou, Beijing (CN); Linhong Han, Beijing (CN); Yu Wang, Beijing (CN)

(73) Assignees: CHENGDU BOE OPTOELECTRONICS TECHNOLOGY CO., LTD., Chengdu (CN); Beijing BOE Technology Development Co., Ltd., Beijing (CN)

( * ) Notice: Subject to any disclaimer, the term of this patent is extended or adjusted under 35 U.S.C. 154(b) by 903 days.

(21) Appl. No.: 17/922,263

(22) PCT Filed: Nov. 26, 2021

(86) PCT No.: PCT/CN2021/133740

§ 371 (c)(1),
(2) Date: Oct. 28, 2022

(87) PCT Pub. No.: WO2023/092512

PCT Pub. Date: Jun. 1, 2023

(65) Prior Publication Data

US 2024/0237396 A1 Jul. 11, 2024

(51) Int. Cl.

| | |
|---|---|
| ***H10K 59/121*** | (2023.01) |
| ***H10K 59/122*** | (2023.01) |
| ***H10K 59/131*** | (2023.01) |

(52) U.S. Cl.
CPC ......... *H10K 59/121* (2023.02); *H10K 59/122* (2023.02); *H10K 59/131* (2023.02)

(58) Field of Classification Search
CPC ... H10K 59/121; H10K 59/122; H10K 59/131
See application file for complete search history.

(56) References Cited

U.S. PATENT DOCUMENTS

| | | | |
|---|---|---|---|
| 2018/0233079 | A1 | 8/2018 | Choi |
| 2018/0247988 | A1 | 8/2018 | Lee et al. |

(Continued)

FOREIGN PATENT DOCUMENTS

| | | | |
|---|---|---|---|
| CN | 109037194 | A | 12/2018 |
| CN | 110047898 | A | 7/2019 |

(Continued)

OTHER PUBLICATIONS

Chinese First Office Action (with English translation) for corresponding Application No. 202180003638.9, dated Apr. 30, 2026, 21 pages.

*Primary Examiner* — Toan Ton
(74) *Attorney, Agent, or Firm* — Dority & Manning, P.A.

(57) ABSTRACT

A display substrate includes a substrate, a first conductive layer including a plurality of first signal lines, a first planarization layer and a plurality of anodes. An orthographic projection of at least one of the plurality of anodes on the substrate is non-overlapped with an orthographic projection of each first signal line on the substrate; and/or an orthographic projection of at least one of the plurality of anodes on the substrate is overlapped with an orthographic projection of one or more first signal lines on the substrate. In an anode and at least one first signal line whose orthographic projections on the substrate are overlapped, the at least one first signal line crosses a setting portion of the anode, so that by taking a center line of the anode in the first direction as (Continued)

an axis of symmetry, heights of the anode at symmetrical positions are substantially equal.

19 Claims, 19 Drawing Sheets

(56) References Cited

U.S. PATENT DOCUMENTS

| | | | | |
|---|---|---|---|---|
| 2019/0148464 | A1 | 5/2019 | Yeom et al. | |
| 2020/0152726 | A1* | 5/2020 | Hong | H10K 50/813 |
| 2021/0126065 | A1* | 4/2021 | Kwon | H10K 59/124 |
| 2021/0159284 | A1* | 5/2021 | Huang | H10K 59/352 |
| 2021/0233989 | A1 | 7/2021 | Li et al. | |
| 2021/0305339 | A1 | 9/2021 | Li | |
| 2021/0319754 | A1* | 10/2021 | Shang | G09G 3/3258 |

FOREIGN PATENT DOCUMENTS

| | | | |
|---|---|---|---|
| CN | 110610980 | A | 12/2019 |
| CN | 112133731 | A | 12/2020 |
| CN | 112366223 | A | 2/2021 |
| CN | 113078196 | A | 7/2021 |
| KR | 20190070767 | A | 6/2019 |
| WO | WO2021189329 | A1 | 9/2021 |

* cited by examiner

DISPLAY SUBSTRATE AND DISPLAY APPARATUS

CROSS-REFERENCE TO RELATED APPLICATION

This application is a national phase entry under 35 USC 371 of International Patent Application No. PCT/CN 2021/133740 filed on Nov. 26, 2021, which is incorporated herein by reference in its entirety.

TECHNICAL FIELD

The present disclosure relates to the field of display technologies, and in particular, to a display substrate and a display apparatus.

BACKGROUND

With the progress of display technologies, organic light-emitting diode (OLED) display apparatuses are one of the hotspots in the research of display technologies nowadays. An OLED display apparatus has various performance parameters that affect the display effect. For example, the performance parameters of the OLED display apparatus mainly include power consumption, image display brightness, image display color coordinates, color gamut and viewing angle color shift.

SUMMARY

In an aspect, a display substrate is provided. The display substrate includes a substrate, a first conductive layer, a first planarization layer and a plurality of anodes. The first conductive layer is disposed on a side of the substrate, and includes a plurality of first signal lines extending in a first direction. The first planarization layer is disposed on a side of the first conductive layer away from the substrate. The plurality of anodes are disposed on a side of the first planarization layer away from the substrate. The first conductive layer is a conductive layer located between the substrate and the plurality of anodes and closest to the plurality of anodes.

An orthographic projection of at least one of the plurality of anodes on the substrate is non-overlapped with an orthographic projection of each first signal line on the substrate; and/or an orthographic projection of at least one of the plurality of anodes on the substrate is overlapped with an orthographic projection of one or more first signal lines on the substrate. In an anode and at least one first signal line whose orthographic projections on the substrate are overlapped, the at least one first signal line crosses a setting portion of the anode, so that by taking a center line of the anode in the first direction as an axis of symmetry, heights of the anode at symmetrical positions are substantially equal.

In some embodiments, in a case where the orthographic projection of the at least one of the plurality of anodes on the substrate is non-overlapped with the orthographic projection of each first signal line on the substrate, at least one first signal line includes at least one straight portion and at least one bent portion that are alternately arranged. A straight portion in the at least one straight portion extends in the first direction, and an orthographic projection of the straight portion on the substrate is located on a side of an orthographic projection of a corresponding anode on the substrate in the first direction. A bent portion in the at least one bent portion includes a first segment, a second segment and a third segment connected in sequence. The second segment extends in the first direction, and an orthographic projection of the second segment on the substrate is located on a side of the orthographic projection of the corresponding anode on the substrate in a second direction. The first segment is connected to the straight portion adjacent to the first segment, and the third segment is connected to another straight portion adjacent to the third segment. The second direction is perpendicular to the first direction.

In some embodiments, in the second direction, a distance between the second segment of the bent portion and the straight portion is in a range of 1 μm to 10 μm.

In some embodiments, in a case where the orthographic projection of the at least one of the plurality of anodes on the substrate is overlapped with the orthographic projection of the one or more first signal lines on the substrate, the at least one first signal line includes a single first signal line, and the orthographic projection of the anode is overlapped with an orthographic projection of the first signal line on the substrate. A setting portion of the anode that the first signal line crosses coincides with the center line of the anode in the first direction.

In some embodiments, in the case where the orthographic projection of the at least one of the plurality of anodes on the substrate is overlapped with the orthographic projection of the one or more first signal lines on the substrate, the at least one first signal line includes at least two first signal lines, and the orthographic projection of the anode is overlapped with orthographic projections of the at least two first signal lines on the substrate. Setting portions of the anode that the at least two first signal lines respectively cross are symmetrical about the center line of the anode in the first direction.

In some embodiments, in the at least one first signal line whose orthographic projection on the substrate is overlapped with the orthographic projection of the anode, a portion, located outside the orthographic projection of the anode, of an orthographic projection of a first signal line on the substrate is non-overlapped with orthographic projections, on the substrate, of other anodes adjacent to the anode in the plurality of anodes.

In some embodiments, in a second direction, a distance between two adjacent first signal lines is in a range of 5 μm to 30 μm. The second direction is perpendicular to the first direction.

In some embodiments, the plurality of first signal lines are a plurality of data lines. The display substrate further includes a second conductive layer and a second planarization layer. The second planarization layer is disposed on a side of the first conductive layer away from the first planarization layer. The second conductive layer is disposed on a side of the second planarization layer away from the first conductive layer. The second conductive layer includes a plurality of voltage signal lines.

In some embodiments, the plurality of first signal lines are a plurality of data lines and a plurality of voltage signal lines.

In some embodiments, the display substrate includes a plurality of pixel circuits, and each pixel circuit includes a plurality of thin film transistors and at least one capacitor. The plurality of pixel circuits include a plurality of first pixel circuits, a plurality of second pixel circuits and a plurality of third pixel circuits. The plurality of pixel circuits are arranged in a plurality of pixel circuit columns, and the plurality of pixel circuit columns include a plurality of first pixel circuit columns and a plurality of second pixel circuit columns. Each first pixel circuit column includes first pixel circuits and second pixel circuits alternately arranged in a column in the first direction. Each second pixel circuit column includes third pixel circuits arranged in a column in the first direction. The plurality of first pixel circuit columns and the plurality of second pixel circuit columns are alternately arranged in a second direction.

The plurality of anodes include a plurality of first anodes, a plurality of second anodes and a plurality of third anodes. The plurality of anodes are arranged in a plurality of anode columns, and the plurality of anode columns include a plurality of first anode columns, a plurality of second anode columns and a plurality of third anode columns. Each first anode column includes first anodes arranged in a column in the first direction, each second anode column includes second anodes arranged in a column in the first direction, and each third anode column includes third anodes arranged in a column in the first direction. In the second direction, the first anode columns, the second anode columns and the third anode columns are periodically arranged in sequence.

In the first pixel circuit column, each first pixel circuit is electrically connected to a first anode, and each second pixel circuit is electrically connected to a second anode. First anodes corresponding to the first pixel circuit column belong to a first anode column, and second anodes corresponding to the first pixel circuit column belong to a second anode column adjacent to the first anode column. In the second pixel circuit column, each third pixel circuit is electrically connected to a third anode. Third anodes corresponding to the second pixel circuit column belong to a same third anode column. The second direction is perpendicular to the first direction.

In some embodiments, the plurality of date lines include a plurality of first data lines and a plurality of second data lines. Each first data line is electrically connected to first pixel circuits and second pixel circuits in a first pixel circuit column, so that the first data line is electrically connected to first anodes included in a first anode column corresponding to the first pixel circuit column and second anodes included in a second anode column corresponding to the first pixel circuit column. Each second data line is electrically connected to third pixel circuits in a second pixel circuit column, so that the second data line is electrically connected to third anodes included in a third anode column corresponding to the second pixel circuit column.

In some embodiments, each data line has a plurality of connection portions correspondingly electrically connected to pixel circuits in a pixel circuit column. A connection portion of the first data line correspondingly connected to a second pixel circuit is covered by a second anode to which the second pixel circuit is electrically connected. Two connection portions of the second data line correspondingly connected to two adjacent third pixel circuits are respectively located on two sides of the second data line.

In some embodiments, in a case where the orthographic projection of the at least one of the plurality of anodes on the substrate is non-overlapped with the orthographic projection of each first signal line on the substrate, a first data line in the plurality of first data lines includes a plurality of straight portions and a plurality of bent portions, and is located between a first anode column and a second anode column adjacent to each other; an orthographic projection of each straight portion on the substrate is located on a side, in the second direction, of an orthographic projection of a first anode in the first anode column on the substrate, and is located on a side, in the first direction, of an orthographic projection of a second anode in the second anode column on the substrate; an orthographic projection of a second segment of each bent portion on the substrate is located on a side, in the second direction, of the orthographic projection of the second anode in the second anode column on the substrate; and/or a second data line in the plurality of second data lines includes a plurality of straight portions and a plurality of bent portions, and is located between a third anode column and a first anode column that are adjacent to each other; an orthographic projection of each straight portion on the substrate is located on a side, in the second direction, of an orthographic projection of a first anode in the first anode column on the substrate, and is located on a side, in the first direction, of an orthographic projection of a third anode in the third anode column on the substrate; an orthographic projection of a second segment of each bent portion on the substrate is located on a side, in the second direction, of the orthographic projection of the third anode in the third anode column on the substrate.

In some embodiments, in third anodes in the third anode column, every two adjacent third anodes are divided into a group, and in the first direction, a distance between two third anodes in each group of third anodes is less than a distance between an entirety of the two third anodes and other surrounding third anode.

The orthographic projection of each straight portion on the substrate is located on a side, in the first direction, of an orthographic projection of a group of third anodes in the third anode column on the substrate. The orthographic projection of the second segment of each bent portion on the substrate is located on a side, in the second direction, of the orthographic projection of the group of third anodes on the substrate.

In some embodiments, in a case where the at least one first signal line includes a single first signal line, and the orthographic projection of the anode is overlapped with an orthographic projection of the first signal line on the substrate, the first signal line is a first data line in the plurality of first data lines. Center lines, in the first direction, of orthographic projections of second anodes in a second anode column on the substrate each coincide with a respective portion of an orthographic projection of the first data line on the substrate.

In some embodiments, in a case where the at least one first signal line includes two first signal lines, and the orthographic projection of the anode is overlapped with orthographic projections of the two first signal lines on the substrate, the two first signal lines are respectively a first data line and a second data line corresponding to a first anode column, a second column and a third column that are adjacent. Orthographic projections of the first data line and the second data line on the substrate are each overlapped with orthographic projections of third anodes included in the third anode column on the substrate, and portions of each third anode that the first data line and the second data line respectively cross are symmetrical about a center line of the third anode in the first direction.

In some embodiments, the orthographic projection of the second data line is non-overlapped with orthographic projections of first anodes adjacent to the second data line on the substrate. The orthographic projection of the first data line is non-overlapped with orthographic projections of second anodes adjacent to the first data line on the substrate; or the orthographic projection of the first data line is overlapped with orthographic projections, on the substrate, of second anodes in a second anode column that is adjacent to the first data line, and overlapping portions of the orthographic projection of the first data line respectively coincide with center lines, in the first direction, of the orthographic projections of the second anodes in the second anode column on the substrate.

In some embodiments, the display substrate further includes a buffer layer, a semiconductor layer, a gate insulating layer, a first gate metal layer, a first insulating layer, a second gate metal layer, a second insulating layer, a pixel defining layer, a plurality of light-emitting functional layers and a cathode layer. The buffer layer is disposed on the substrate. The semiconductor layer is disposed on a side of the buffer layer away from the substrate, and includes a plurality of semiconductor patterns. Each semiconductor pattern includes active layers of the plurality of thin film transistors in the pixel circuit. The gate insulating layer is disposed on a side of the semiconductor layer away from the substrate. The first gate metal layer is disposed on a side of the gate insulating layer away from the substrate. The first gate metal layer includes a plurality of first patterns, and each first pattern is a first electrode plate of a capacitor in the pixel circuit. The first insulating layer is disposed on a side of the first gate metal layer away from the substrate. The second gate metal layer disposed on a side of the first insulating layer away from the substrate. The second gate metal layer includes a plurality of second patterns, and each second pattern is a second electrode plate of the capacitor in the pixel circuit. The second insulating layer is disposed on a side of the second gate metal layer away from the substrate. The pixel defining layer is disposed on a side of the plurality of anodes and the first planarization layer away from the substrate. The pixel defining layer defines a plurality of openings, and each opening exposes at least a portion of an anode in the plurality of anodes. The plurality of light-emitting functional layers are disposed on a side of the plurality of anodes away from the substrate. Each light-emitting functional layer is located in an opening in the plurality of openings. The cathode layer is disposed on a side of the light-emitting functional layers away from the substrate. The cathode layer extends to a side of the pixel defining layer away from the substrate, and covers the pixel defining layer.

In some embodiments, each pixel circuit includes at least a compensation transistor, a driving transistor and the capacitor. An active layer of the compensation transistor includes a first electrode region, a second electrode region and a channel region connecting the first electrode region and the second electrode region. An active layer of the driving transistor includes a first electrode region, a second electrode region and a channel region connecting the first electrode region and the second electrode region. A portion of the first electrode plate of the capacitor whose orthographic projection on the substrate is overlapped with an orthographic projection of the channel region of the driving transistor on the substrate serves as a gate of the driving transistor. The first electrode region of the compensation transistor is electrically connected to the second electrode region of the driving transistor. The second conductive layer further includes a plurality of connection structures, and the second electrode region of the compensation transistor is electrically connected to the gate of the driving transistor through a connection structure in the plurality of connection structures. An orthographic projection of each second anode on the substrate is overlapped with orthographic projections of connection structures in two adjacent pixel circuits on the substrate. One of the two adjacent pixel circuits is a second pixel circuit electrically connected to the second anode, and another one of the two adjacent pixel circuits is a third pixel circuit adjacent to the second pixel circuit.

In some embodiments, an orthographic projection of each data line on the substrate is overlapped with orthographic projections, on the substrate, of second electrode plates of capacitors in pixel circuits in a pixel circuit column to which the data line is electrically connected.

In another aspect, a display apparatus is provided. The display apparatus includes the display substrate according to any one of the above embodiments in the above aspect.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on an actual size of a product, an actual process of a method and an actual timing of a signal involved in the embodiments of the present disclosure.

DETAILED DESCRIPTION

Figure 1:
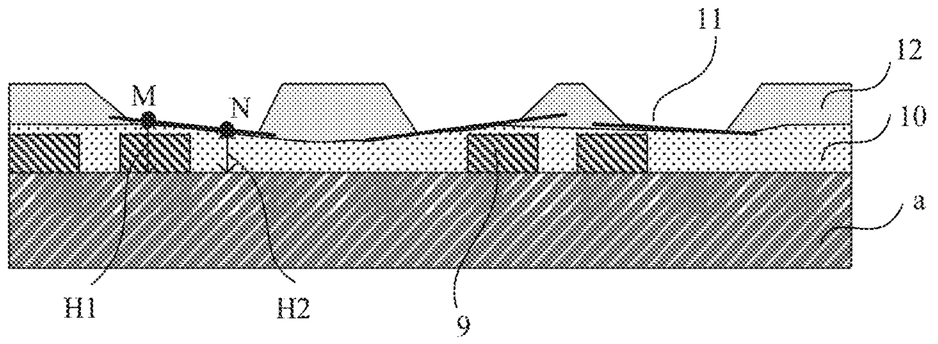
FIG. 1 is a sectional view of a display substrate, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments." "exemplary embodiments," "an example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the terms such as "coupled" and "electrically connected" and extensions thereof may be used. For example, the term "connected" may be used in the description of some embodiments to indicate that two or more components are in direct physical or electrical contact with each other. For another example, the term "electrically connected" may be used in the description of some embodiments to indicate that two or more components are in direct electrical contact. However, the term "electrically connected" may also mean that two or more components are not in direct contact with each other, but still cooperate or interact with each other. The embodiments disclosed herein are not necessarily limited to the contents herein.

The phrase "at least one of A, B and C" has the same meaning as the phrase "at least one of A, B or C", both including following combinations of A, B and C: only A, only B, only C, a combination of A and B, a combination of A and C, a combination of B and C, and a combination of A, B and C.

The phrase "A and/or B" includes following three combinations: only A, only B, and a combination of A and B.

The use of the phase "applicable to" or "configured to" herein means an open and inclusive expression, which does not exclude devices that are applicable to or configured to perform additional tasks or steps.

In addition, the use of the phase "based on" means openness and inclusiveness, since a process, step, calculation or other action that is "based on" one or more stated conditions or values may, in practice, be based on additional conditions or values exceeding those stated.

As used herein, the term such as "about," "substantially" or "approximately" includes a stated value and an average value within an acceptable range of deviation of a particular value. The acceptable range of deviation is determined by a person of ordinary skill in the art, considering measurement in question and errors associated with measurement of a particular quantity (i.e., limitations of a measurement system).

Exemplary embodiments are described herein with reference to sectional views and/or plan views as idealized exemplary drawings. In the accompanying drawings, thicknesses of layers and sizes of regions are enlarged for clarity. Thus, variations in shape relative to the accompanying drawings due to, for example, manufacturing techniques and/or tolerances may be envisaged. Therefore, the exemplary embodiments should not be construed to be limited to the shapes of regions shown herein, but to include deviations in shape due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

It will be noted that the embodiments and features of the embodiments in the present disclosure may be combined with each other without conflict. The present disclosure will be described in detail below with reference to the accompanying drawings in combination with the embodiments.

At present, with the progress of display technologies, it is necessary to optimize various performances of a display apparatus. Performance parameters of the display apparatus mainly include power consumption, image display brightness, image display color coordinates, color gamut and viewing angle color shift. There are many influence factors of the viewing angle color shift. For example, in a plurality of pixels for image display, a flatness of an anode corresponding to each pixel has a great influence on the color shift. For example, as shown in FIG. 1, from a perspective of a design of a circuit structure in a display substrate, a pattern of a metal conductive layer 9 closest to an anode 11 has a greatest influence on a flatness of the anode 11, which results in non-uniform heights of the anode at different positions. For example, for a certain anode, if a metal conductive pattern is disposed on a lower left side of the anode 11, and no metal conductive pattern is disposed on a lower right side of the anode 11, a left position of the anode is higher than a right position of the anode, and the metal conductive pattern located below the anode causes the anode to be "inclined". Thus, a light-emitting functional layer disposed on the anode has non-uniform thicknesses, so that an intensity of light emitted from a pixel to a left side of this pixel and an intensity of light emitted from this pixel to a right side of this pixel are inconsistent. In this case, the display panel has a large viewing angle color shift, and when viewed visually, a side of the display panel is reddish, and another side of the display panel is bluish.

Figure 2:
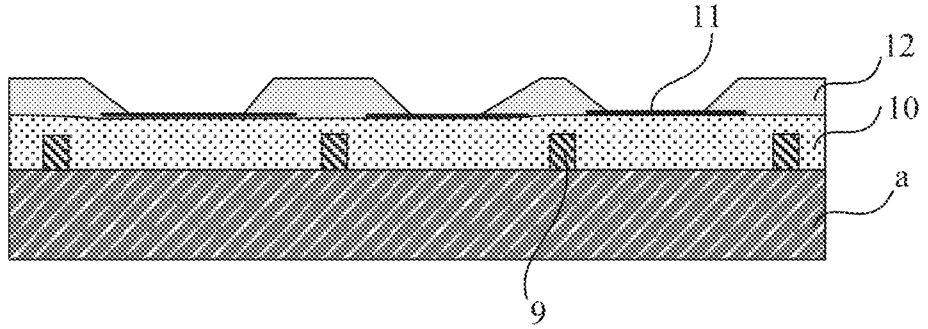
FIG. 2 is a sectional view of another display substrate, in accordance with some embodiments.
Figure 3:
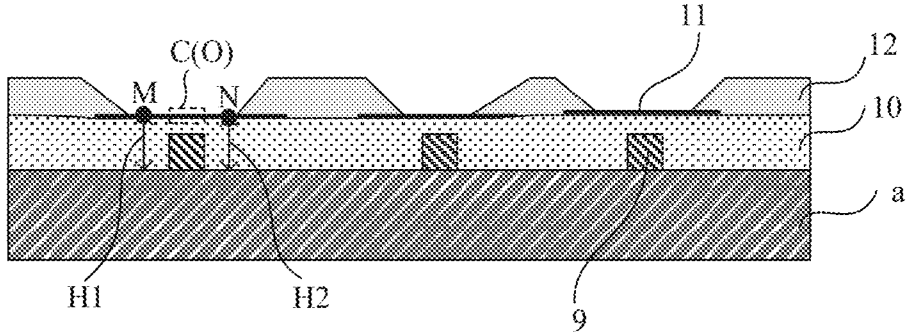
FIG. 3 is a sectional view of yet another display substrate, in accordance with some embodiments.
Figure 4:
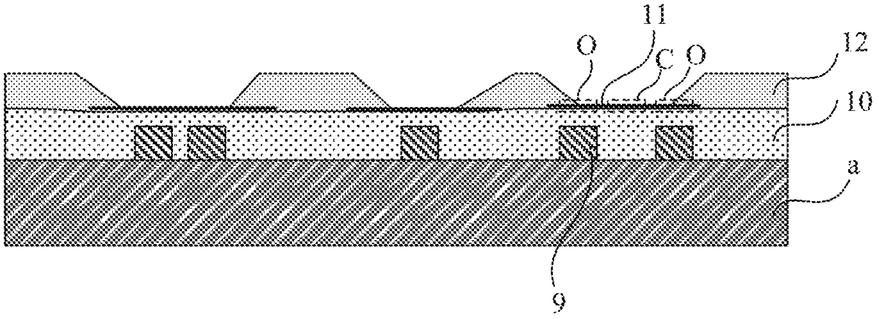
FIG. 4 is a sectional view of yet another display substrate, in accordance with some embodiments.

To this end, as shown in FIGS. 2 to 4, in embodiments of the present disclosure, by adjusting positional relationships of patterns of a metal conductive layer and anodes, a flatness of a plane where the anodes are located is improved, so as to avoid color shift of a display panel caused by a fact that the plane where the anodes are located is "inclined" relative to a horizontal plane. Here, a represents a plurality of film layers located on a side of the metal conductive layer 9 away from the anode 11.

Figure 5:
FIG. 5 is a structural diagram of a display apparatus, in accordance with some embodiments.

Some embodiments of the present disclosure provide a display apparatus 1000. As shown in FIG. 5, the display apparatus 1000 is an apparatus or device for visually displaying electronic information. For example, the display apparatus 1000 may be any product or component with a display function, such as a smart phone, a tablet computer, a television, a display, a notebook computer, or other wearable electronic device (e.g., a watch).

For example, the display apparatus 1000 may be an electroluminescent display apparatus or a photoluminescent display apparatus. In a case where the display apparatus 1000 is the electroluminescent display apparatus, the electroluminescent display apparatus may be an organic light-emitting diode (OLED) display apparatus or a quantum dot light-emitting diode (QLED) display apparatus. In a case where the display apparatus 1000 is the photoluminescent display apparatus, the photoluminescent display apparatus may be a quantum dot photoluminescent display apparatus.

In some embodiments, the display apparatus 1000 is an active-matrix organic light-emitting diode (AMOLED) display apparatus, which has characteristics of fast response speed, high contrast, wide viewing angle and low power consumption, and is one of the hotspots in the research of display technologies nowadays.

Figure 6:
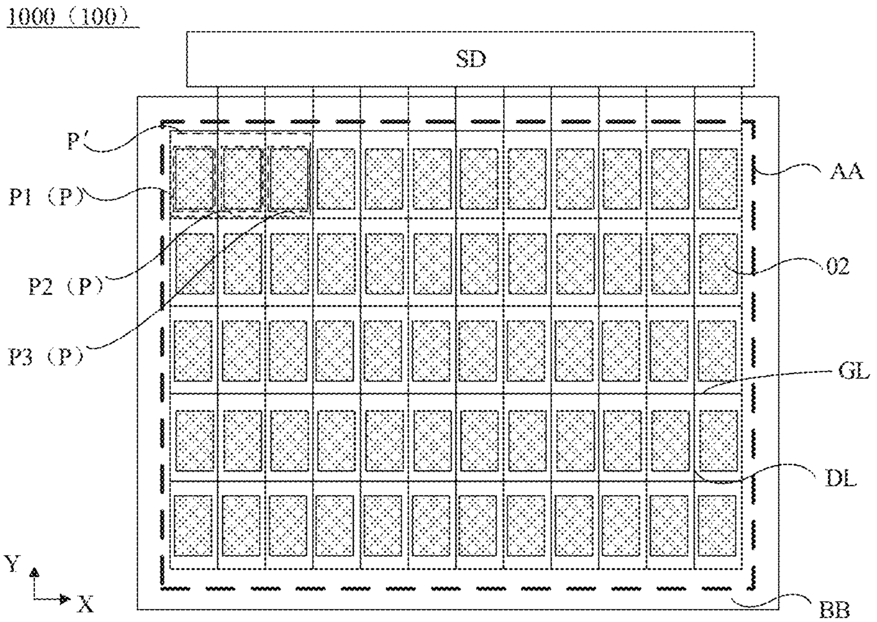
FIG. 6 is a structural diagram of a display substrate, in accordance with some embodiments.

As shown in FIG. 6, the display apparatus 1000 includes a display substrate 100. The display substrate 100 has a display area (i.e., active area, AA; also referred to as an effective display area) AA and a peripheral area BB located on at least one side of the display area AA.

In the display substrate 100, a plurality of pixels P' and a plurality of signal lines are provided in the display area AA, and the plurality of signal lines are electrically connected to the plurality of pixels P'. For example, each pixel P' includes sub-pixels P of at least three colors. The sub-pixels P of the colors include at least a first sub-pixel P1, a second sub-pixel P2 and a third sub-pixel P3. Light-emitting colors of the first sub-pixel P1, the second sub-pixel P2 and the third sub-pixel P3 are different from each other, and the three colors are three primary colors (e.g., red, green and blue, respectively).

A pixel circuit for controlling a sub-pixel P to display is provided in the sub-pixel P. The pixel circuit is disposed on a substrate 1 of the display substrate 100. A gate line GL connected to the sub-pixel P is used for transmitting a scan signal to the pixel circuit in the sub-pixel P. A data line DL connected to the sub-pixel P is used for transmitting a data signal to the pixel circuit in the sub-pixel P. The data signal comes from a source driver (SD) coupled to data lines DL.

Figure 24:
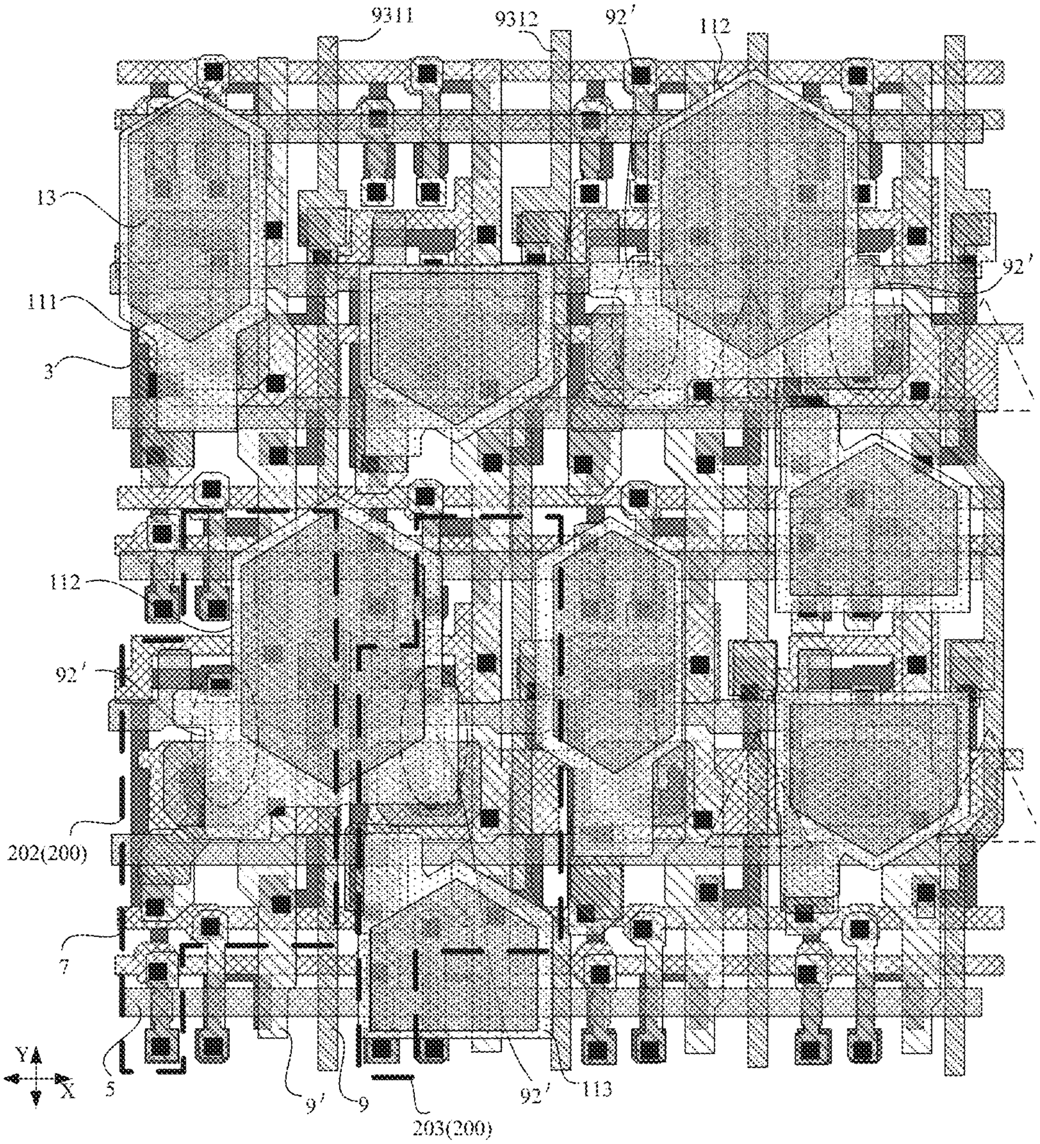
Figure 25:
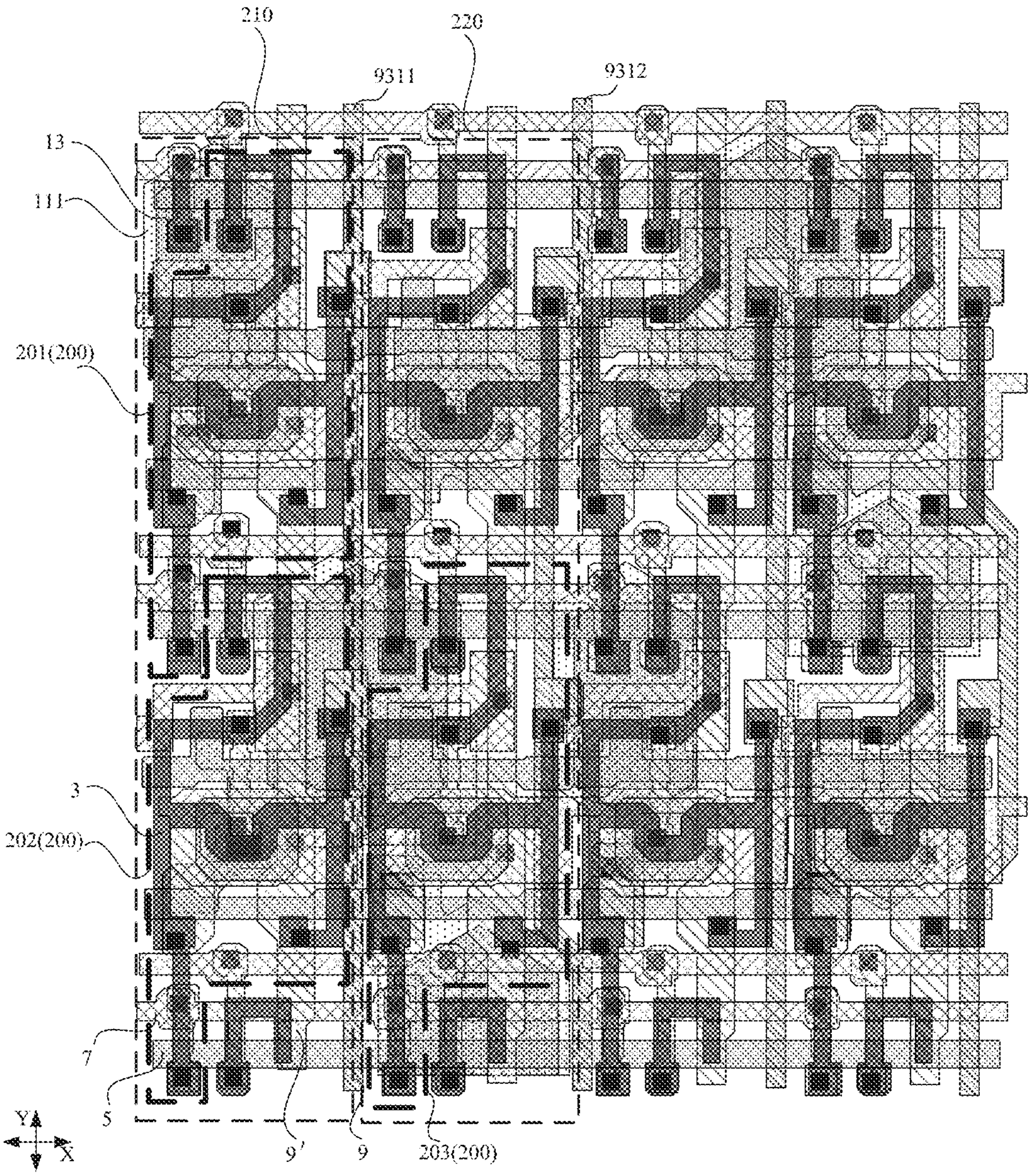
FIG. 25 is another plan view of the film layers in the display substrate in FIG. 24.

In some embodiments, as shown in FIG. 25, the display substrate 100 includes a plurality of pixel circuits 200. It will be noted that in order to clearly show structures of film layers in the display substrate 100, an order of stacking the film layers shown in FIG. 25 is opposite to an order of stacking the film layers in FIG. 24. That is, in FIG. 25, an uppermost layer is a semiconductor layer 3, and a lowermost layer includes a plurality of light-emitting functional layers 13. For example, the plurality of pixel circuits 200 include a plurality of first pixel circuits 201, a plurality of second pixel circuits 202 and a plurality of third pixel circuits 203. The plurality of pixel circuits 200 are arranged in a plurality of pixel circuit columns, and the plurality of pixel circuit columns include a plurality of first pixel circuit columns 210 and a plurality of second pixel circuit columns 220. Each first pixel circuit column 210 includes first pixel circuits 201 and second pixel circuits 202 alternately arranged in a column in a first direction Y. Each second pixel circuit column 220 includes third pixel circuits 203 arranged in a column in the first direction Y. The first pixel circuit columns 210 and the second pixel circuit columns 220 are alternately arranged in a second direction X.

Figure 7A:
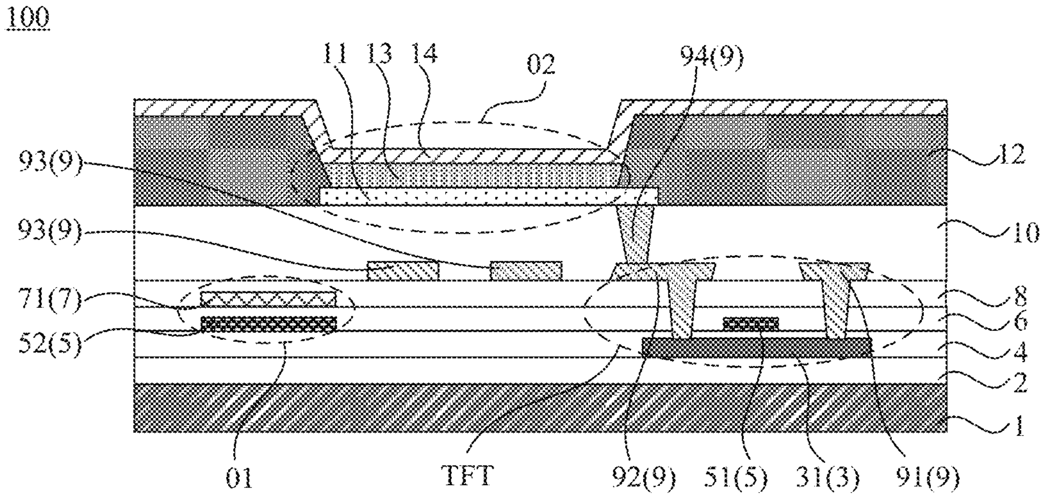
FIG. 7A is a partial sectional view of a display substrate, in accordance with some embodiments.
Figure 26:
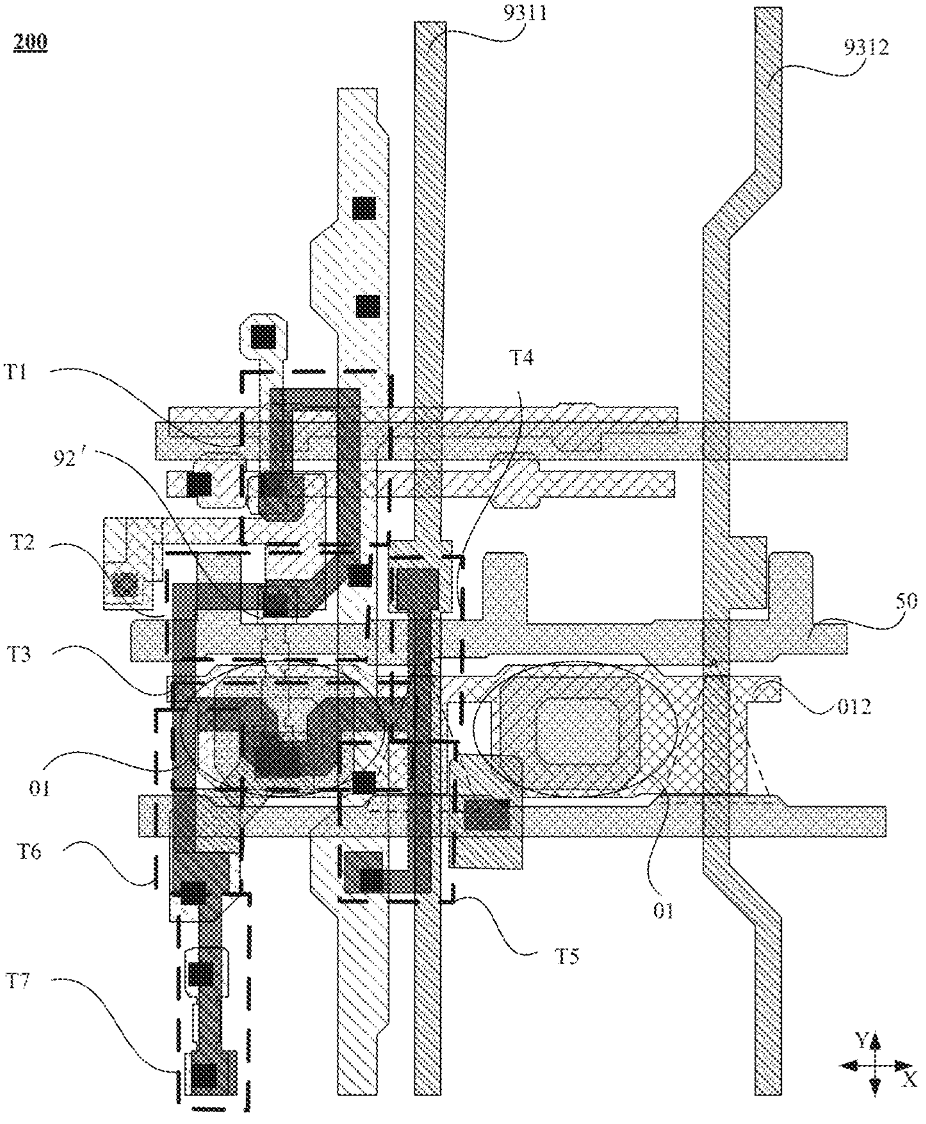
FIG. 26 is a plan view of film layers in a single pixel circuit of the display substrate in FIG. 25.

Each pixel circuit 200 includes a plurality of thin film transistors TFT and at least one capacitor 01. For example, as shown in FIGS. 7C and 26, the pixel circuit 200 includes a first reset transistor T1, a compensation transistor T2, a driving transistor T3, a writing transistor T4, a first light-emitting control transistor T5, a second light-emitting control transistor T6, a second reset transistor T7 and the capacitor 01. A control electrode of the first reset transistor T1 is electrically connected to a first reset signal terminal Reset1, a first electrode of the first reset transistor T1 is electrically connected to a first initialization signal terminal Vinit1, and a second electrode of the first reset transistor T1 is electrically connected to a first node N1. A control electrode of the compensation transistor T2 is electrically connected to a scan signal terminal Gate, a first electrode of the compensation transistor T2 is electrically connected to a second node N2, and a second electrode of the compensation transistor T2 is electrically connected to the first node N1. A control electrode of the driving transistor T3 is electrically connected to the first node N1, a first electrode of the driving transistor T3 is electrically connected to a third node N3, and a second electrode of the driving transistor T3 is electrically connected to the second node N2. A control electrode of the writing transistor T4 is electrically connected to the scan signal terminal Gate, a first electrode of the writing transistor T4 is electrically connected to a data writing signal terminal VData, and a second electrode of the writing transistor T4 is electrically connected to the third node N3. A control electrode of the first light-emitting control transistor T5 is electrically connected to an enable signal terminal EM, a first electrode of the first light-emitting control transistor T5 is electrically connected to a first power supply voltage terminal VDD, and a second electrode of the first light-emitting control transistor T5 is electrically connected to the third node N3. A control electrode of the second light-emitting control transistor T6 is electrically connected to the enable signal terminal EM, a first electrode of the second light-emitting control transistor T6 is electrically connected to the second node N2, and a second electrode of the second light-emitting control transistor T6 is electrically connected to an anode of a light-emitting device 02. A control electrode of the second reset transistor T7 is electrically connected to a second reset signal terminal Reset2, a first electrode of the second reset transistor T7 is electrically connected to a second initialization signal terminal Vinit2, and a second electrode of the second reset transistor T7 is electrically connected to the anode of the light-emitting device 02. A second electrode plate 012 of the capacitor 01 is electrically connected to the first power supply voltage terminal VDD, and a first electrode plate 011 of the capacitor 01 is electrically connected to the first node N1. A cathode of the light-emitting device 02 is electrically connected to a second power supply voltage terminal VSS.

It can be understood that the first pixel circuit 201, the second pixel circuit 202 and the third pixel circuit 203 have the same circuit structure.

A first electrode of a thin film transistor TFT described above may be a source, and a second electrode of the thin film transistor TFT may be a drain; or the first electrode of the thin film transistor TFT may be a drain, and the second electrode of the thin film transistor TFT may be a source, which is not limited in the embodiments of the present disclosure. The first node N1, the second node N2 and the third node N3 do not represent actual components, but represent junctions of electrical connections of related sub-circuits or electronic elements in circuit diagrams. That is, these nodes are nodes that are equivalent to the junctions of the electrical connections of the related sub-circuits or electronic elements in the circuit diagrams. In addition, the "VDD" in the first power supply voltage terminal VDD is a constant high level signal, and a voltage signal is not limited to a constant high level signal such as VDD or VGH in the embodiments of the present disclosure. Similarly, the "VSS" in the second power supply voltage terminal VSS is a constant low level signal, and a voltage signal is not limited to a constant low level signal such as VSS, Vinit or VGL in the embodiments of the present disclosure.

It will be noted that thin film transistors include P-type thin film transistors and N-type thin film transistors according to on-off type. The type of the thin film transistor provided in the embodiments of the present disclosure is not limited, and the thin film transistor may be a P-type thin film transistor or an N-type thin film transistor, which may be set according to specific implementations. Thin film transistors include bottom-gate thin film transistors and top-gate thin film transistors according to the type of film layer structure. The type of the thin film transistor provided in the embodiments of the present disclosure is not limited, and the top-gate thin film transistor is taken as an example in following embodiments.

In some embodiments, as shown in FIGS. 7A, 7B, 18 to 24, from bottom to top, the film layers included in the display substrate 100 are the substrate 1, a buffer layer 2, the semiconductor layer 3, a gate insulating layer 4, a first gate metal layer 5, a first insulating layer 6, a second gate metal layer 7, a second insulating layer 8, a first conductive layer 9, a first planarization layer 10, a plurality of anodes 11, a pixel defining layer 12, the plurality of light-emitting functional layer 13, and a cathode layer 14.

A material used for the substrate 1 may include a polymer resin or glass. For example, the material used for the substrate may include the polymer resin, such as one of polyethersulfone (PES), polyarylate (PAR), polyetherimide (PEI), polyethylene naphthalate (PEN), polyethylene terephthalate (PET), polyphenylene sulfide (PPS), polyimide (PI), polycarbonate (PC), cellulose triacetate (CTA) and cellulose acetate propionate (CAP). For example, the substrate 1 may be flexible, and includes a glass material containing $SiO_2$ as a main component; or the substrate 1 may be rigid, and includes a resin such as a reinforced plastic. The substrate 1 may have a stacked structure including polymer resin layer(s) and blocking layer(s) each located on the polymer resin layer. For example, the substrate 1 may have a stacked structure including a first polymer resin layer, a first blocking layer, a second polymer resin layer and a second blocking layer. The substrate including the polymer resin may improve flexibility. The first blocking layer and the second blocking layer each may include at least one of silicon nitride ($SiN_x$), silicon oxynitride (SION) and silicon oxide ($SiO_x$), which is not limited thereto in the embodiments of the present disclosure.

The buffer layer 2 is disposed on the substrate 1. A material used for the buffer layer 2 may include an inorganic insulating material such as silicon nitride ($SiN_x$, x>0), silicon oxynitride (SiON) or silicon oxide ($SiO_x$, x>0), and the buffer layer 2 may include a single-layer or multi-layer structure containing the foregoing inorganic insulating material. The buffer layer 2 may function to provide a buffer when the substrate 1 is patterned.

Figure 18:
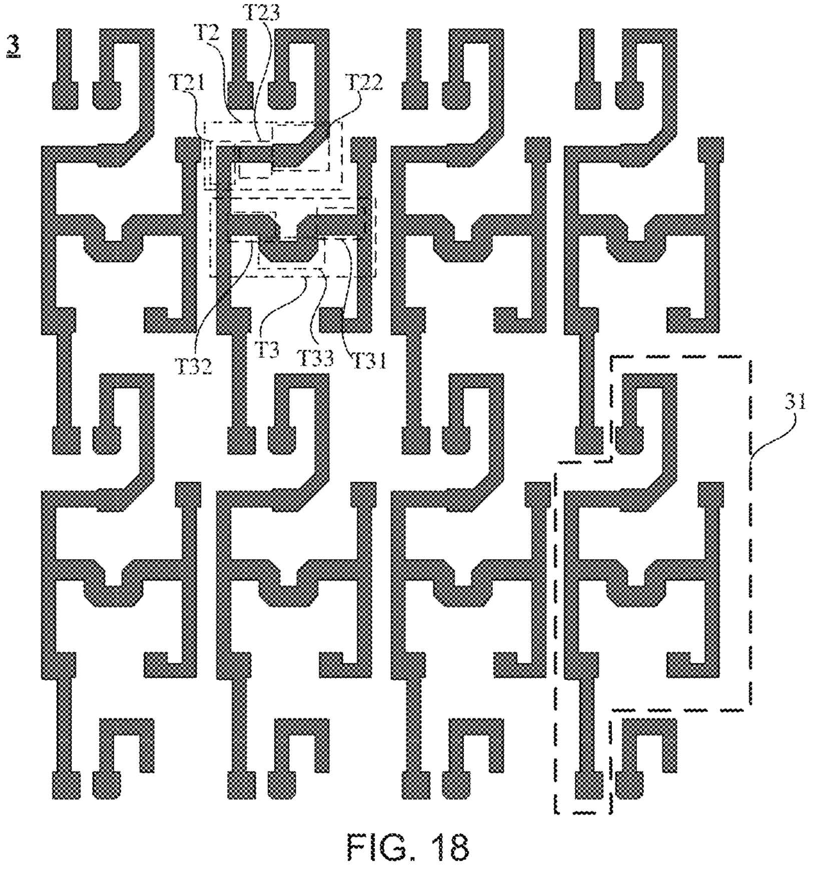
FIGS. 18 to 24 are plan views of film layers in the display substrate in FIG. 7B.

The semiconductor layer 3 is disposed on a side of the buffer layer 2 away from the substrate 1. A material used for the semiconductor layer 3 may include polycrystalline silicon, amorphous silicon, an oxide semiconductor or an organic semiconductor. As shown in FIG. 18, the semiconductor layer 3 includes a plurality of semiconductor patterns 31. Each semiconductor pattern 31 includes active layers of the plurality of thin film transistors TFT in the pixel circuit 200. For example, the active layer of the compensation transistor T2 in the pixel circuit 200 includes a first electrode region T21, a second electrode region T22 and a channel region T23 connecting the first electrode region T21 and the second electrode region T22. The active layer of the driving transistor T3 includes a first electrode region T31, a second electrode region T32 and a channel region T33 connecting the first electrode region T31 and the second electrode region T32. The first electrode region T21 and the second electrode region T22 of the compensation transistor T2 are respectively the first electrode and the second electrode of the compensation transistor T2 in FIG. 7C. The first electrode region T31 and the second electrode region T32 of the driving transistor T3 are respectively the first electrode and the second electrode of the driving transistor T3 in FIG. 7C.

The gate insulating layer 4 is disposed on a side of the semiconductor layer 3 away from the substrate 1. A material used for the gate insulating layer 4 may include inorganic insulating material(s), such as at least one of silicon oxide, silicon nitride, silicon oxynitride, aluminium oxide, titanium oxide, tantalum oxide and hafnium oxide. The gate insulating layer 4 may also include a single-layer or multi-layer structure containing the foregoing material(s).

Figure 19:
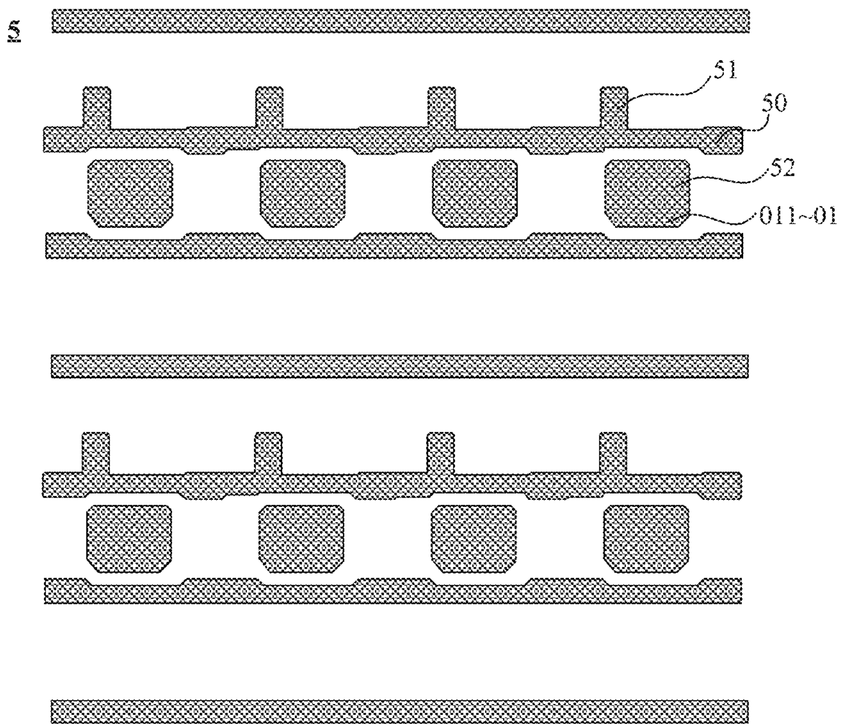

The first gate metal layer 5 is disposed on a side of the gate insulating layer 4 away from the substrate 1. A material used for the first gate metal layer 5 may include a low-resistance metal material, and the low-resistance metal material may include, for example, conductive material(s), such as at least one of molybdenum (Mo), magnesium (Mg), aluminum (Al), copper (Cu), and titanium (Ti). The first gate metal layer 5 may also include a single-layer or multi-layer structure containing the foregoing material(s). The first gate metal layer 5 includes a plurality of gate scan lines 50 and a plurality of first patterns 52. At least one of the plurality of gate scan lines is first gate scan line(s) 50. The first gate scan line 50 is electrically connected to the scan signal terminal Gate in the pixel circuit shown in FIG. 7C. Each first pattern 52 is a first electrode plate 011 of a capacitor 01 in a pixel circuit 200. The first electrode plate 011 of the capacitor 01 is a first electrode of the capacitor 01 shown in FIG. 7C. For example, as shown in FIGS. 18, 19 and 26, a portion of the first gate scan line 50 whose orthographic projection on the substrate 1 is overlapped with an orthographic projection of a channel region T23 of a compensation transistor T2 on the substrate 1 serves as a gate (i.e., control electrode) of this compensation transistor T2. For example, the first gate scan line 50 has a plurality of protrusions 51. An orthographic projection of each protrusion 51 on the substrate 1 is overlapped with an orthographic projection of a channel region T23 of a compensation transistor T2 on the substrate 1, and this protrusion 51 serves as a gate 51 of this compensation transistor T2. A portion of the first electrode plate 011 of each capacitor 01 whose orthographic projection on the substrate 1 is overlapped with an orthographic projection of a channel region T33 of a driving transistor T3 on the substrate 1 serves as a gate of this driving transistor T3.

The first insulating layer 6 is disposed on a side of the first gate metal layer 5 away from the substrate 1. A material used for the first insulating layer 6 may include inorganic insulating material(s), such as at least one of silicon oxide, silicon nitride, silicon oxynitride, aluminium oxide, titanium oxide, tantalum oxide and hafnium oxide. The first insulating layer 6 may also include a single-layer or multi-layer structure containing the foregoing material(s).

Figure 20:
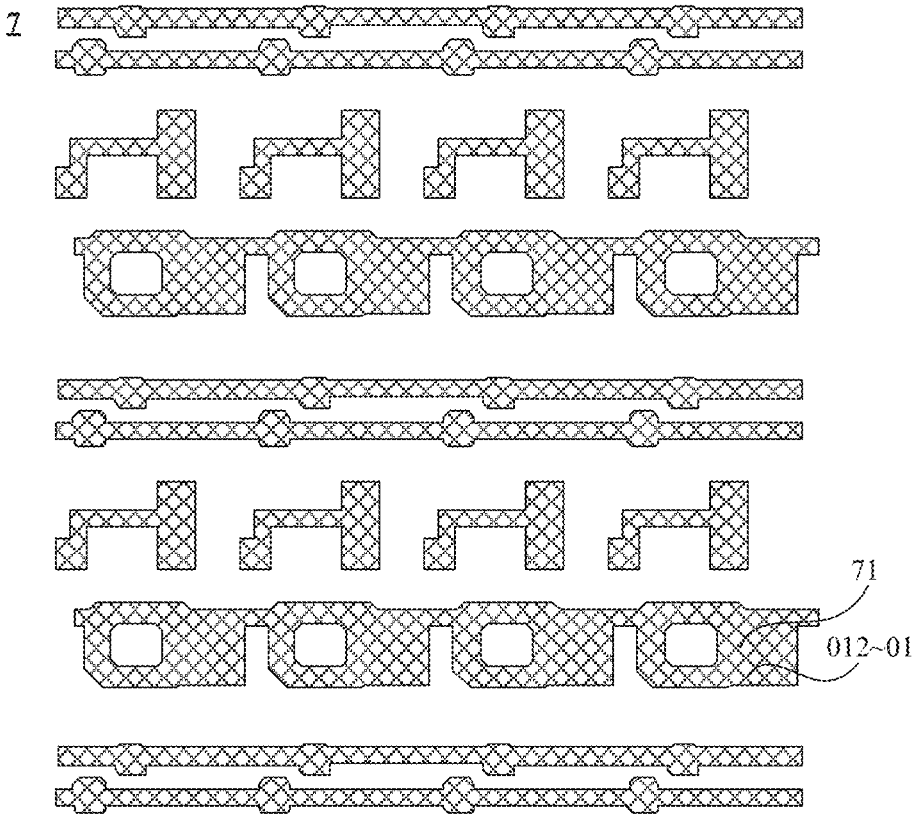

The second gate metal layer 7 is disposed on a side of the first insulating layer 6 away from the substrate 1. As shown in FIG. 20, the second gate metal layer 7 includes a plurality of second patterns 71. Each second pattern 71 is a second electrode plate 012 of a capacitor 01 in a pixel circuit 200. As shown in FIG. 26, the second electrode plates 012 cooperate with respective first electrode plates 011 of the capacitors 01 formed in the first gate metal layer 5, so as to serve as storage capacitors for providing storage capacitances for respective pixel circuits 200. For example, since the second electrode plates 012 of the capacitors 01 in the plurality of pixel circuits receive a constant voltage signal, second patterns 71 in each row may be connected as a whole. The second gate metal layer 7 and the first gate metal layer 5 may be made of a same material.

The second insulating layer 8 is disposed on a side of the second gate metal layer 7 away from the substrate 1. A material used for the second insulating layer 8 may include inorganic insulating material(s), such as at least one of silicon oxide, silicon nitride, silicon oxynitride, aluminium oxide, titanium oxide, tantalum oxide and hafnium oxide. The second insulating layer 8 may also include a single-layer or multi-layer structure containing the foregoing material(s).

The first conductive layer 9 is disposed on a side of the second insulating layer 8 away from the substrate 1. A material used for the first conductive layer 9 may include any one or more of a conductive material containing molybdenum (Mo), a conductive material containing magnesium (Mg), a conductive material containing aluminum (Al), a conductive material containing copper (Cu) and a conductive material containing titanium (Ti). The first conductive layer 9 includes a plurality of first signal lines 93, and the plurality of first signal lines 93 are a plurality of data lines and a plurality of voltage signal lines. The first conductive layer 9 further includes sources 91 and drains 92 of thin film transistors TFT in the plurality of pixel circuits 200, and a plurality of first transfer electrodes 94. The source 91 and the drain 92 each may include a single-layer or multi-layer structure containing the foregoing material(s). For example, the source 91 and the drain 92 each may include a multi-layer structure of Ti/Al/Ti.

The first planarization layer 10 is disposed on a side of the first conductive layer 9 away from the substrate 1. A material used for the first planarization layer 10 may include an organic insulating material, an inorganic insulating material, or inorganic and organic insulating materials. For example, the organic insulating material includes any one or more of a general-purpose polymer such as polymethyl methacrylate (PMMA) or polystyrene (PS), a polymer derivative with a phenol group, an acryloyl polymer, an imide polymer, an aryl ether polymer, an amide polymer, a fluorine polymer, a p-xylene polymer and a vinyl alcohol polymer. For example, the material used for the first planarization layer 10 includes polyimide.

The plurality of anodes 11 are disposed on a side of the first planarization layer 10 away from the substrate 1. A material used for the plurality of anodes 11 may include conductive oxide(s), such as any one or more of indium tin oxide (ITO), indium zinc oxide (IZO), zinc oxide (ZnO), indium oxide ($In_2O_3$), indium gallium oxide (IGO) and aluminum zinc oxide (AZO). For example, the material used for the plurality of anodes 11 includes indium tin oxide (ITO).

The pixel defining layer 12 is disposed on a side of the plurality of anodes 11 and the first planarization layer 10 away from the substrate 1. The pixel defining layer 12 defines a plurality of openings, and each opening exposes at least a portion of an anode 11. A material used for the pixel defining layer 12 includes at least one of an inorganic insulating material and an organic insulating material, such as silicon nitride ($SiN_x$), silicon oxynitride (SiON) or silicon oxide ($SiO_x$).

The plurality of light-emitting functional layers 13 are disposed on a side of the plurality of anodes 11 away from the substrate 1, and each light-emitting functional layer 13 is located in an opening. The plurality of light-emitting functional layers 13 each may have a single-layer or multi-layer structure. For example, the light-emitting functional layer 13 includes only a light-emitting layer. Alternatively, the light-emitting functional layer 13 includes a hole injection layer, a hole transport layer, the light-emitting layer, an electron transport layer and an electron injection layer. A material used for the light-emitting functional layer 13 includes an inorganic light-emitting material or an organic light-emitting material. For example, different types of organic light-emitting materials emit light of different colors.

The cathode layer 14 is disposed on a side of the light-emitting functional layers 13 away from the substrate 1. The cathode layer 14 extends to a side of the pixel defining layer 12 away from the substrate 1, and covers the pixel defining layer 12. A material used for the cathode layer 14 may include a (semi-) transparent layer. The (semi-) transparent layer includes any one or more of silver (Ag), magnesium (Mg), aluminum (Al), platinum (Pt), gold (Au), nickel (Ni), chromium (Cr) and lithium (Li). For example, the material used for the cathode layer 14 includes aluminum (Al).

Figure 7B:
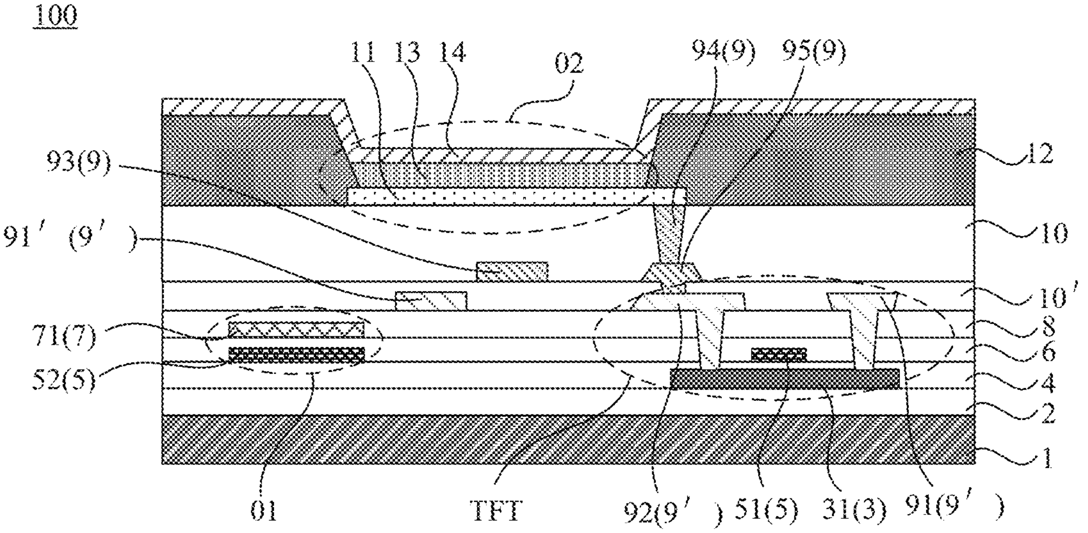
FIG. 7B is a partial sectional view of another display substrate, in accordance with some embodiments.
Figure 7C:
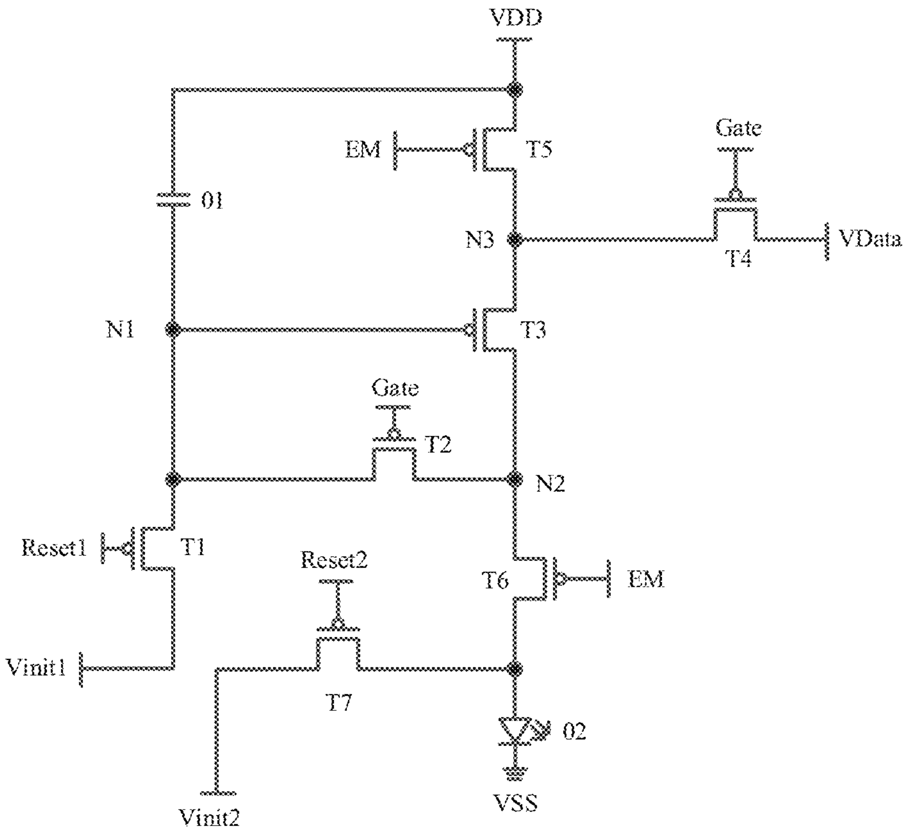
FIG. 7C is an equivalent circuit diagram of a pixel circuit, in accordance with some embodiments.

In some embodiments, as shown in FIG. 7B, the display substrate 100 further includes a second conductive layer 9' and a second planarization layer 10'. The second planarization layer 10' is disposed on a side of the first conductive layer 9 away from the first planarization layer 10. In this case, the first conductive layer 9 includes a plurality of first signal lines 93, a plurality of first transfer electrodes 94 and a plurality of second transfer electrodes 95.

Figure 21:
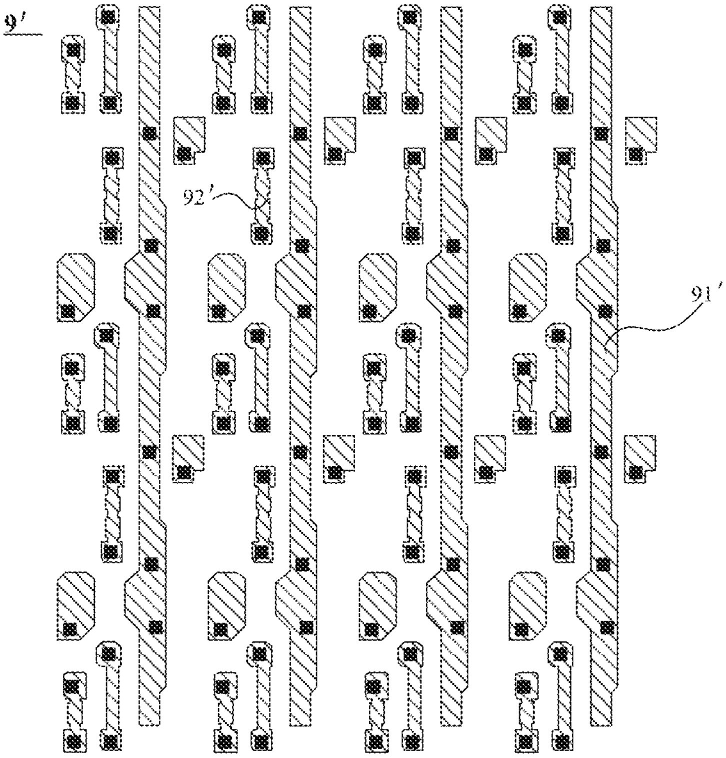
Figure 22:
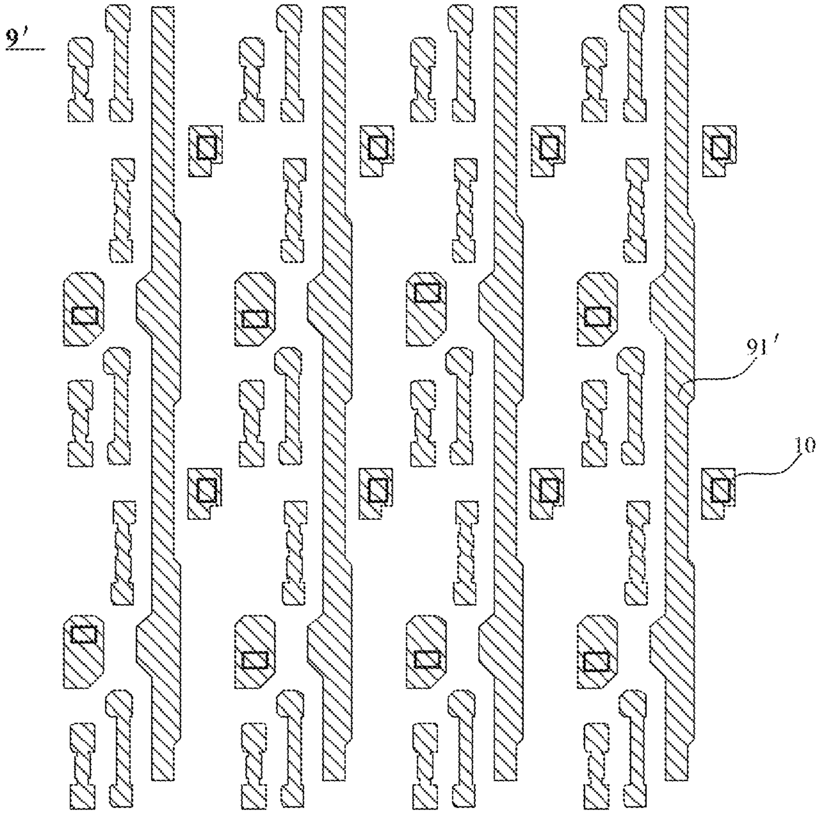

The second conductive layer 9' is disposed on a side of the second planarization layer 10' away from the first conductive layer 9. As shown in FIGS. 21 and 22, the second conductive layer includes a plurality of second signal lines 91', a plurality of connection structures 92', and the sources 91 and the drains 92 of the thin film transistors TFT in the plurality of pixel circuits 200. The plurality of second signal lines 91' are a plurality of voltage signal lines. That is, the display substrate 100 has a structure of double metal conductive layers. The second conductive layer 9' and the first conductive layer 9 may be made of a same material.

As shown in FIG. 7A, in a case where the display substrate 100 does not include the second conductive layer 9' and the second planarization layer 10', the plurality of first signal lines 93 included in the first conductive layer 9 are the plurality of data lines and the plurality of voltage signal lines. The first conductive layer 9 further includes the sources 91 and the drains 92 of the thin film transistors TFT in the plurality of pixel circuits 200, and the plurality of first transfer electrodes 94. The plurality of first transfer electrodes 94 connect a film layer where the plurality of anodes 11 are located and the first conductive layer 9. For example, each first transfer electrode 94 connects an anode 11 and a drain 92 of a thin film transistor TFT.

Figure 15:
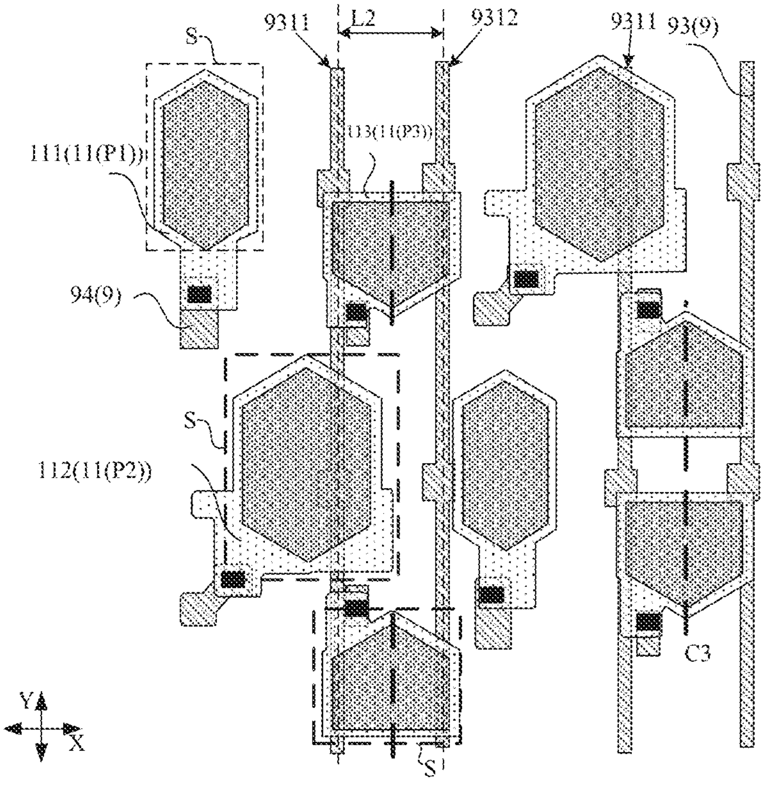
FIG. 15 is a diagram showing yet another film layer structure of a display substrate, in accordance with some embodiments.

It will be noted that as shown in FIG. 15, in a case where the first conductive layer 9 includes the plurality of first signal lines 93 and the first transfer electrodes 94, the first transfer electrodes 94 are non-overlapped with patterns of moved and bent first signal lines 93, so that the first transfer electrodes 94 and the plurality of first signal lines 93 are ensured to operate normally.

As shown in FIG. 7B, in a case where the display substrate 100 further includes the second conductive layer 9' and the second planarization layer 10', the plurality of first signal lines 93 included in the first conductive layer 9 are the plurality of data lines, and the first conductive layer 9 further includes the plurality of first transfer electrodes 94 and the plurality of second transfer electrodes 95. The plurality of second signal lines 91' included in the second conductive layer 9' are the plurality of voltage signal lines. The second conductive layer 9' further includes the sources 91 and the drains 92 of the thin film transistors TFT in the plurality of pixel circuits 200. The plurality of second transfer electrodes 95 connect the first conductive layer 9 and the second conductive layer 9'. For example, each second transfer electrode 95 connects a first transfer electrode 94 and a drain 92 of a thin film transistor TFT, so that the thin film transistor TFT is electrically connected to an anode 11 corresponding thereto.

It will be noted that as shown in FIG. 7B, in a case where the first conductive layer 9 includes the plurality of first signal lines 93, the plurality of first transfer electrodes 94 and the plurality of second transfer electrodes 95, no matter how the shape of the first signal line 93 is changed, it is ensured that the first transfer electrodes 94 and the second transfer electrodes 95 are non-overlapped with patterns of moved and bent first signal lines 93, so that the first transfer electrodes 94 and the plurality of first signal lines 93 are ensured to operate normally.

In some embodiments, as shown in FIG. 6, the display substrate 100 includes a plurality of sub-pixels P, and the plurality of sub-pixels P include a plurality of first sub-pixels P, a plurality of second sub-pixels P2 and a plurality of third sub-pixels P3. In some examples, the plurality of first sub-pixels P1, the plurality of second sub-pixels P2 and the plurality of third sub-pixels P2 are arranged as follows.

Figure 8A:
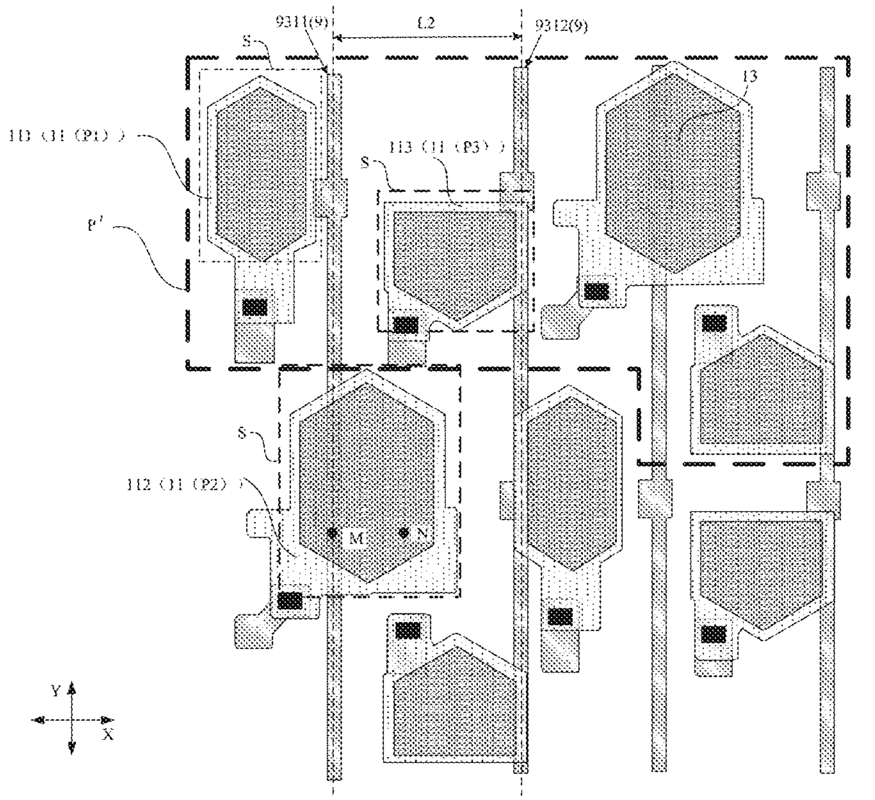
FIG. 8A is a diagram showing a film layer structure of a display substrate, in accordance with some embodiments.

As shown in FIG. 8A, the plurality of sub-pixels P are arranged in a plurality of sub-pixel columns. The plurality of sub-pixel columns include a plurality of first sub-pixel columns, a plurality of second sub-pixel columns and a plurality of third sub-pixel columns. In the second direction X, the plurality of first sub-pixel columns, the plurality of second sub-pixel columns and the plurality of third sub-pixel columns included in the plurality of sub-pixel columns are periodically arranged in sequence. In the first direction Y, first sub-pixels P1 are located in a same column, second sub-pixels P2 are located in a same column, and third sub-pixels P3 are located in a same column. The first direction Y is perpendicular to the second direction X. In some embodiments, sub-pixels P in two adjacent columns of sub-pixels P are mutually staggered.

For example, the first sub-pixel P1 is a red sub-pixel, the second sub-pixel P2 is a blue sub-pixel, and the third sub-pixel P3 is a green sub-pixel; or the first sub-pixel P1 is a blue sub-pixel, the second sub-pixel P2 is a red sub-pixel, and the third sub-pixel P3 is a green sub-pixel. Here, as long as the first sub-pixel P1, the second sub-pixel P2 and the third sub-pixel P3 are sub-pixels of different colors, and the embodiments of the present disclosure are not limited thereto. Following embodiments will be described in an example where the first sub-pixel P1 is a red sub-pixel, the second sub-pixel P2 is a blue sub-pixel, and the third sub-pixel P3 is a green sub-pixel.

In some examples, as shown in FIG. 8A, a pixel P' includes four sub-pixels P. For example, a pixel P' includes a first sub-pixel P1, a second sub-pixel P2 and two third sub-pixels P3.

In some other examples, a pixel P' includes three sub-pixels P. For example, a pixel P' includes a first sub-pixel P1, a second sub-pixel P2 and a third sub-pixel P3.

It can be understood that the number of sub-pixels P of different colors included in the pixel P' is related to actual configuration requirements of the display apparatus 1000, and may be set by a person skilled in the art according to actual needs. The number of sub-pixels P of different colors included in the pixel P' is not limited, as long as the plurality of sub-pixels P are coupled to the gate lines GL and the data lines DL, thereby realizing image display under a control of corresponding signals.

In some embodiments, as shown in FIG. 8A, in a case where the plurality of sub-pixels P include the plurality of first sub-pixels P1, the plurality of second sub-pixels P2 and the plurality of third sub-pixels P3, each first sub-pixel P1 includes a first anode 111, each second sub-pixel P2 includes a second anode 112, and each third sub-pixel P3 includes a third anode 113.

Figure 8B:
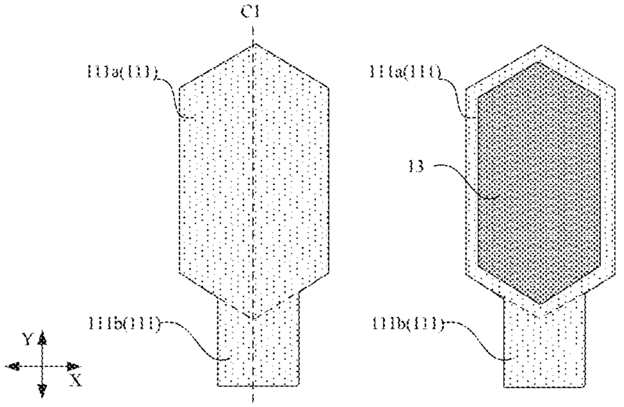
FIG. 8B is a structural diagram of an anode, in accordance with some embodiments.
Figure 8C:
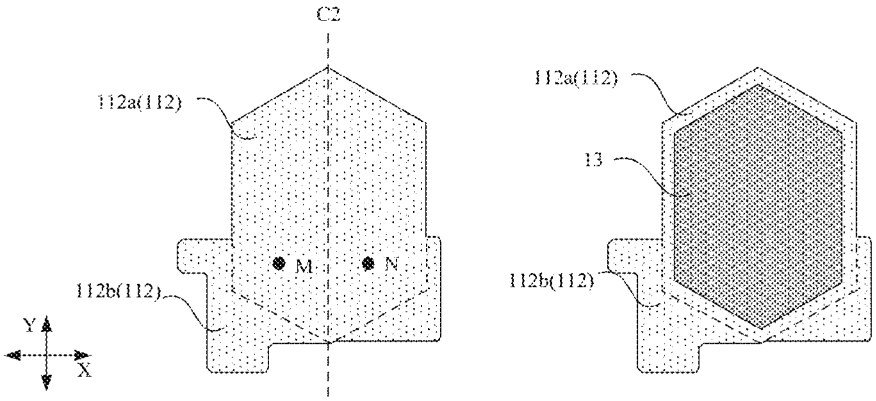
FIG. 8C is a structural diagram of another anode, in accordance with some embodiments.
Figure 8D:
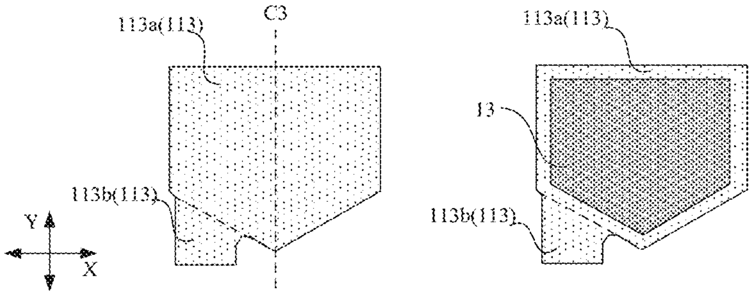
FIG. 8D is a structural diagram of yet another anode, in accordance with some embodiments.

It can be understood that each of the plurality of first sub-pixels P1 further includes a light-emitting functional layer 13 and a cathode. The first anode 111, the light-emitting functional layer 13 and the cathode constitute a light-emitting device 02. Similarly, each second sub-pixel P2 further includes a light-emitting functional layer 13 and a cathode, and each third sub-pixel P3 further includes a light-emitting functional layer 13 and a cathode. Shapes of the first anode 111, the second anode 112 and the third anode 113 are different from each other. As shown in FIGS. 8B to 8D, the first anode 111 and the second anode 112 are approximately hexagonal in shape, and the third anode 113 is approximately pentagonal in shape. A size of each anode 11 is adapted to a size of a light-emitting functional layer 13 in a sub-pixel P of a different color, thereby ensuring that each sub-pixel P has an effective light-emitting region.

For example, as shown in FIG. 8B, the first anode 111 includes a first anode body portion 111*a* and a first anode extension portion 111*b*. A shape of the first anode body portion 111*a* is consistent with a shape of a light-emitting functional layer 13 corresponding thereto. For example, both the first anode body portion 111*a* and the light-emitting functional layer 13 corresponding thereto are hexagonal. Moreover, an orthographic projection of the light-emitting functional layer 13 corresponding to the first anode 111 on the substrate 1 is located within an orthographic projection of the first anode body portion 111*a* on the substrate 1, thereby ensuring that a sub-pixel P corresponding to the first anode 111 has an effective light-emitting region. The first anode extension portion 111*b* is located in a region outside the effective light-emitting region, and is configured to be electrically connected to a thin film transistor TFT. The shape of the first anode body portion 111*a* is a hexagon, and a center line of the hexagon in the first direction Y may be regarded as a center line C1 of the first anode 111. A shape of the first anode extension portion 111*b* has a negligible influence on the position of the center line C1 of the first anode 111. It will be noted that the center line C1 of the first anode 111 refers to a center line of an effective light-emitting region of the first anode 111, and the effective light-emitting region is an overlapping region of an anode, a light-emitting functional layer and a cathode in the light-emitting device.

For example, as shown in FIG. 8C, the second anode 112 includes a second anode body portion 112*a* and a second anode extension portion 112*b*. A shape of the second anode body portion 112*a* is consistent with a shape of a light-emitting functional layer 13 corresponding thereto. For example, both the second anode body portion 112*a* and the light-emitting functional layer 13 corresponding thereto are hexagonal. Moreover, an orthographic projection of the light-emitting functional layer 13 corresponding to the second anode 112 on the substrate 1 is located within an orthographic projection of the second anode body portion 112*a* on the substrate 1, thereby ensuring that a sub-pixel P corresponding to the second anode 112 has an effective light-emitting region. The second anode extension portion 112*b* is located in a region outside the effective light-emitting region, and is configured to be electrically connected to a thin film transistor TFT. The shape of the second anode body portion 112*a* is a hexagon, and a center line of the hexagon in the first direction Y may be regarded as a center line C2 of the second anode 112. A shape of the second anode extension portion 112*b* has a negligible influence on the position of the center line C2 of the second anode 112.

For example, as shown in FIG. 8D, the third anode 113 includes a third anode body portion 113*a* and a third anode extension portion 113*b*. A shape of the third anode body portion 113*a* is consistent with a shape of a light-emitting functional layer 13 corresponding thereto. For example, both the third anode body portion 113*a* and the light-emitting functional layer 13 corresponding thereto are pentagonal. Moreover, an orthographic projection of the light-emitting functional layer 13 corresponding to the third anode 113 on the substrate 1 is located within an orthographic projection of the third anode body portion 113*a* on the substrate 1, thereby ensuring that a sub-pixel P corresponding to the third anode 113 has an effective light-emitting region. The third anode extension portion 113*b* is located in a region outside the effective light-emitting region, and is configured to be electrically connected to a thin film transistor TFT. The shape of the third anode body portion 113*a* is a pentagon, and a center line of the pentagon in the first direction Y is approximately a center line C3 of the third anode 113. A shape of the third anode extension portion 113*b* has a negligible influence on the position of the center line C3 of the third anode 113.

An arrangement of a plurality of first anodes 111 in the plurality of first sub-pixels P1, a plurality of second anodes 112 in the plurality of second sub-pixels P2, and a plurality of third anodes 113 in the plurality of third sub-pixels P3 is consistent with the arrangement of the plurality of sub-pixels P. For example, as shown in FIG. 8A, the plurality of anodes 11 are arranged in a plurality of anode columns. The plurality of anode columns include a plurality of first anode columns, a plurality of second anode columns and a plurality of third anode columns.

For example, each first anode column includes first anodes 111 arranged in a column in the first direction Y. Each second anode column includes second anodes 112 arranged in a column in the first direction Y. Each third anode column includes third anodes 113 arranged in a column in the first direction Y.

In the second direction X, the first anode columns, the second anode columns and the third anode columns are periodically arranged in sequence. Anodes 11 included in two adjacent anode columns are mutually staggered. For example, as shown in FIG. 8A, in a second anode column and a third anode column that are adjacent to each other, a portion of each second anode 112 is inserted between two adjacent third anodes 113, and a portion of each third anode 113 is inserted between two adjacent second anodes 112.

In some embodiments, as shown in FIGS. 24 and 25, in the first pixel circuit column 210, each first pixel circuit 201 is electrically connected to a first anode 111, and each second pixel circuit 202 is electrically connected to a second anode 112. First anodes 111 corresponding to the first pixel circuit column 210 belong to a first anode column, and second anodes 112 corresponding to this first pixel circuit column 210 belong to a second anode column adjacent to this first anode column. In the second pixel circuit column 220, each third pixel circuit 203 is electrically connected to a third anode 113. Third anodes 113 corresponding to the second pixel circuit column 220 belong to a same third anode column.

In some embodiments, as shown in FIGS. 7B and 8A, in the case where the display substrate 100 includes the first conductive layer 9 and the second conductive layer 9', the first conductive layer 9 includes the plurality of first signal lines 93, and the plurality of first signal lines 93 are the plurality of data lines. The first conductive layer 9 further includes the plurality of first transfer electrodes 94 and the plurality of second transfer electrodes 95. The second conductive layer 9' includes the plurality of second signal lines 91', and the plurality of second signal lines 91' are the plurality of voltage signal lines. The second conductive layer 9' further includes the sources 91 and the drains 92 of the thin film transistors TFT.

The plurality of first signal lines 93 extend in the first direction Y. Classified according to connection relationships between the plurality of data lines and different sub-pixels P (or anodes 11), the plurality of data lines include a plurality of first data lines 9311 and a plurality of second data lines 9312. Each first data line 9311 is electrically connected to first pixel circuits 201 and second pixel circuits 202 in a first pixel circuit column 210, so that this first data line 9311 is electrically connected to first anodes 111 included in a first anode column corresponding to this first pixel circuit column 210 and second anodes 112 included in a second anode column corresponding to this first pixel circuit column 210.

Each second data line 9312 is electrically connected to third pixel circuits 203 in a second pixel circuit column 220, so that this second data line 9312 is electrically connected to third anodes 113 included in a third anode column corresponding to this second pixel circuit column 220.

Figure 23:
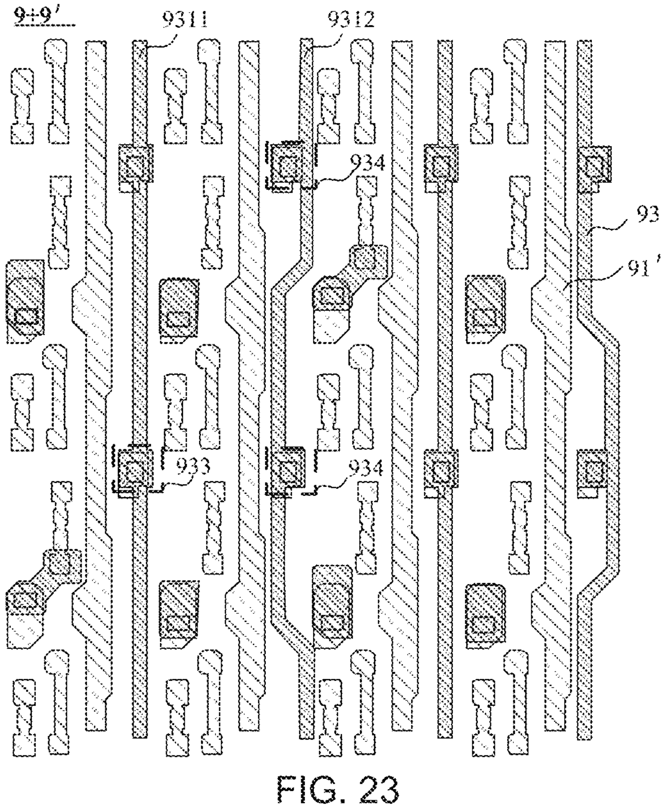

In some embodiments, as shown in FIGS. 23 and 24, each data line has a plurality of connection portions correspondingly electrically connected to pixel circuits 200 in a pixel circuit column. Arrangement positions of the connection portions and extending directions of the connection portions relative to this data line where the connection portions are located are related to positions of anodes to which this data line is electrically connected, and may be set according to actual needs.

For example, as shown in FIGS. 23 and 24, a connection portion 933 of the first data line 9311 correspondingly connected to a second pixel circuit 202 is covered by a second anode 112 to which this second pixel circuit 202 is electrically connected. Two connection portions 934 of the second data line 9312 correspondingly connected to two adjacent third pixel circuits 203 are respectively located on two sides of this second data line 9312.

The plurality of second signal lines 91' extend in the first direction Y, and are configured to transmit power supply voltage signals to the pixel circuits in the plurality of sub-pixels P.

It will be noted that each data line is electrically connected to corresponding anodes 11 through the thin film transistors TFT in the pixel circuits 220 in the sub-pixels P.

In some examples, as shown in FIGS. 7B and 8A, each first data line 9311 crosses second anodes 112 in a second anode column. An orthographic projection of each first data line 9311 on the substrate 1 is overlapped with orthographic projections S of the second anodes 112 in the second anode column on the substrate 1. Moreover, the first data line 9311 crosses a left side of the second anode 112, which results in an “inclined” second anode 112 due to a higher left position of the second anode 112 than a right position of the second anode 112. For example, as shown by the left anode 11 in FIG. 1, in an example where this anode 11 is a second anode 112 in FIG. 8A or 8C, a position M and a position N of the second anode 112 are symmetrical positions of the second anode 112 (with the center line C2 as an axis of symmetry). The left position M of the second anode 112 is higher than the right position N of the second anode 112, and a height H1 of the second anode 112 at the position M is greater than a height H2 of the second anode 112 at the position N, so that the second anode 112 is “inclined”. As shown in FIG. 1, a height of an anode at a certain position refers to a distance between a surface of the anode 11 at this position away from the substrate 1 and a surface of the substrate 1 proximate to the anode in a direction perpendicular to a plane where the substrate 1 is located.

Each second data line 9312 crosses third anodes 113 in a third anode column and first anodes 111 in a first anode column that is adjacent to this third anode column. An orthographic projection of each second data line 9312 on the substrate 1 is overlapped with orthographic projections S of the third anodes 113 in the third anode column on the substrate 1. The second data line 9312 crosses a right position of the third anode 113, which results in an “inclined” third anode 113 due to a higher right position of the third anode 113 than a left position of the third anode 113 (as shown by the middle anode 11 in FIG. 1). The third anode 113 has a similar presentation as the second anode 112, which will not be repeated here.

Moreover, the orthographic projection of each second data line 9312 on the substrate 1 is overlapped with orthographic projections S of the first anodes 111 in the first anode column on the substrate 1. Moreover, the second data line 9312 crosses a left position of the first anode 111, which results in an “inclined” first anode 111 due to a higher left position of the first anode 111 than a right position of the first anode 111 (as shown by the right anode 11 in FIG. 1). The first anode 111 has a similar presentation as the second anode 112, which will be not repeated here.

Since a surface of the anode 11 is not flat, the anode 11 has unequal heights at symmetrical positions with a center line C of the anode 11 in the first direction Y as an axis of symmetry, which results in non-uniform thicknesses of a light-emitting functional layer 13 disposed on the anode 11. Thus, an intensity of light emitted from a pixel to a left side of this pixel and an intensity of light emitted from this pixel to a right side of this pixel are inconsistent. In this case, the display substrate 100 has a large viewing angle color shift, and when viewed visually, a side of the display substrate 100 is reddish, and another side of the display substrate 100 is bluish. Referring to FIGS. 1, 3, 8A and 8C, a height of the anode 11 at a symmetrical position with the center line C of the anode 11 in the first direction Y as the axis of symmetry refers to a distance between a surface of the anode 11 at the symmetrical position away from the substrate 1 and the surface of the substrate 1 proximate to the anode 11 in the direction perpendicular to the plane where the substrate 1 is located. The symmetrical position of the anode 11 is, for example, the position M or the position N, and the position M and the position N are arranged axisymmetrically with respect to the center line C2.

It will be noted that as shown in FIG. 7B, in a direction perpendicular to the substrate 1, the second conductive layer 9' is farther from the plurality of anodes 11 than the first conductive layer 9. Moreover, the first planarization layer 10 and the second planarization layer 10' are disposed between the second conductive layer 9' and the plurality of anodes 11. Therefore, the patterns of the second conductive layer 9' have a negligible influence on a flatness of a surface of the first planarization layer 10 away from the substrate 1 through the planarization effect of the two planarization layers. Similarly, the patterns of the semiconductor layer 3, the first gate metal layer 5 and the second gate metal layer 7 also have a negligible influence on the flatness of the surface of the first planarization layer 10 away from the substrate 1.

In the case where the display substrate 100 includes the first conductive layer 9 and does not include the second conductive layer 9', the plurality of signal lines 93 included in the first conductive layer 9 are the plurality of data lines and the plurality of voltage signal lines, and orthographic projections of the plurality of first signal lines 93 on the substrate 1 are each overlapped with an orthographic projection of an anode 11 on the substrate 1. Thus, the anode 11 is “inclined”, so that the display substrate 100 has the color shift.

It will be noted that as shown in FIGS. 7A and 7B, the first conductive layer 9 is a conductive layer located between the substrate 1 and the plurality of anodes 11 and closest to the plurality of anodes 11. That is, there are no other conductive patterned film layer(s) between the first conductive layer 9 and the plurality of anodes 11. The patterned film layer means that the film layer includes a plurality of patterns. For example, the first conductive layer 9, the second conductive layer 9' and the first gate metal layer 5 are patterned film layers. For example, the first conductive layer 9 includes a plurality of patterns to form the plurality of data lines. The second conductive layer 9' includes a plurality of patterns to form the plurality of voltage signal lines. The first gate metal layer 5 includes a plurality of patterns to form the plurality of gate scan lines. Since the first conductive layer 9 is a patterned film layer closest to the plurality of anodes 11, the flatness of surfaces of the plurality of anodes is influenced by the arrangement of the plurality of first signal lines in the first conductive layer.

Based on this, as shown in FIGS. 9A to 17, the display substrate 100 is provided. The color shift is improved by adjusting positional relationships of the anodes 11 and the first signal lines 93.

Figure 11:
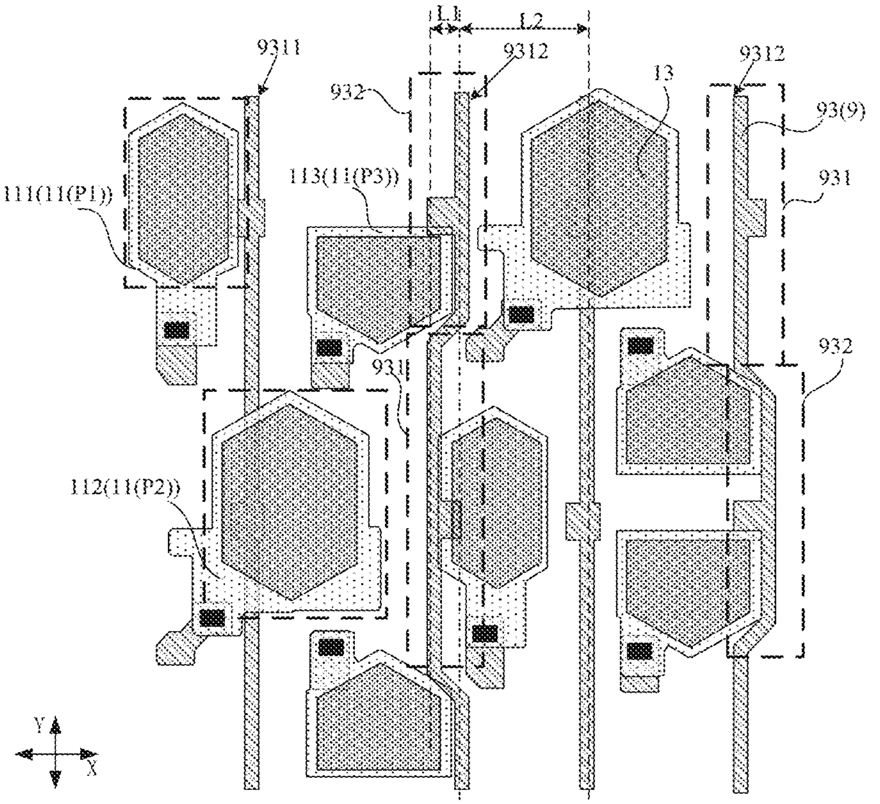
FIG. 11 is a diagram showing another film layer structure of a display substrate, in accordance with some embodiments.
Figure 12:
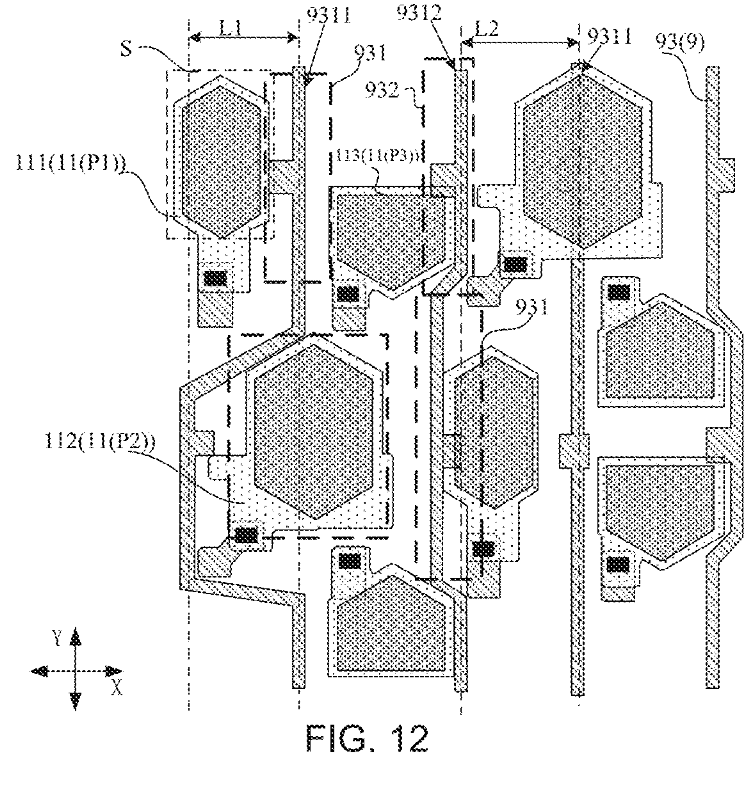
FIG. 12 is a diagram showing yet another film layer structure of a display substrate, in accordance with some embodiments.

As shown in FIGS. 11 and 12, in some embodiments, orthographic projection(s) of at least one of the plurality of anodes 11 on the substrate 1 are non-overlapped with an orthographic projection of each first signal line 93 on the substrate 1.

As shown in FIGS. 13 to 17, in some other embodiments, orthographic projection(s) of at least one of the plurality of anodes 11 on the substrate 1 are each overlapped with orthographic projection(s) of at least one first signal line 93 on the substrate 1. In an anode and at least one first signal line 93 whose orthographic projections on the substrate 1 are overlapped, the at least one first signal line 93 crosses a setting portion of the anode 11, so that by taking the center line C of the anode 11 in the first direction Y as the axis of symmetry, heights of the anode 11 at positions symmetrical about the axis of symmetry are substantially equal based on the setting portion that the at least one first signal line 93 crosses.

A height of the anode 11 at a symmetrical position refers to a distance between a surface of the anode 11 at the symmetrical position away from the substrate 1 and the surface of the substrate 1 proximate to the anode 11 in the direction perpendicular to the plane where the substrate 1 is located. For example, as shown in FIGS. 3 and 10D, with the center line C of the anode 11 in the first direction Y as the axis of symmetry, the positions of the anode 11 symmetrical about the center line C are M and N, respectively. A distance between the position M and the substrate 1 is H1, and a distance between the position N and the substrate 1 is H2. In this way, the heights of the anode 11 at the positions symmetrical about the axis of symmetry are substantially equal, which means that H1 and H2 are substantially equal.

In the above embodiments, since the orthographic projection(s) S of the at least one of the plurality of anodes 11 on the substrate 1 are non-overlapped with the orthographic projection of each first signal line 93 on the substrate 1, it is ensured that no first signal line 93 crosses the at least one anode 11. Therefore, non-uniform heights of the anode 11 at left and right positions due to first signal line(s) 93 disposed below the anode 11 are avoided, and thus the anode 11 is prevented from being “inclined”. Thus, an intensity of light emitted from a sub-pixel P where the anode 11 is located to a left side of this sub-pixel P and an intensity of light emitted from this sub-pixel P to a right side of this sub-pixel P are prevented from being inconsistent. Alternatively, the orthographic projection(s) of the at least one of the plurality of anodes 11 on the substrate 1 are each overlapped with the orthographic projection(s) of the at least one first signal line 93 on the substrate 1. Moreover, the at least one first signal line 93 crosses the respective setting position(s) of the anode 11, so that by taking the center line C of the anode 11 in the first direction Y as the axis of symmetry, the heights of the anode 11 at the positions symmetrical about the axis of symmetry are substantially equal. Therefore, the anode 11 is also prevented from being “inclined”. Thus, an intensity of light emitted from a sub-pixel P where the anode 11 is located to a left side of this sub-pixel P and an intensity of light emitted from this sub-pixel P to a right side of this sub-pixel P are prevented from being inconsistent. The above two designs are able to improve the surface flatness and the height uniformity of the anode 11, thereby avoiding the large viewing angle color shift of the display substrate 100. Details will be described below.

Figure 9A:
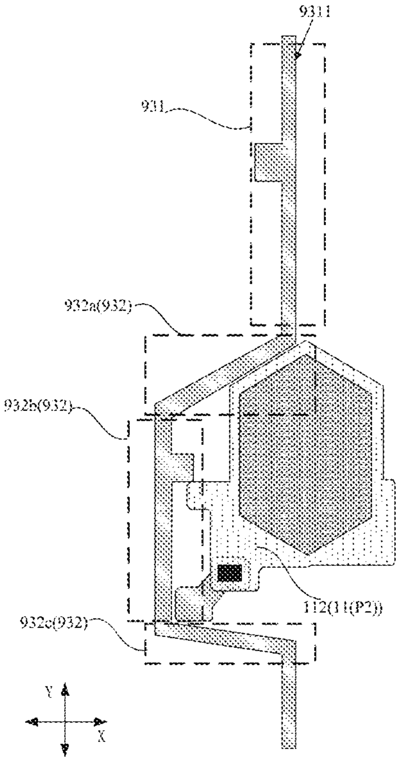
FIG. 9A is a structural diagram of an anode and a signal line, in accordance with some embodiments.
Figure 9B:
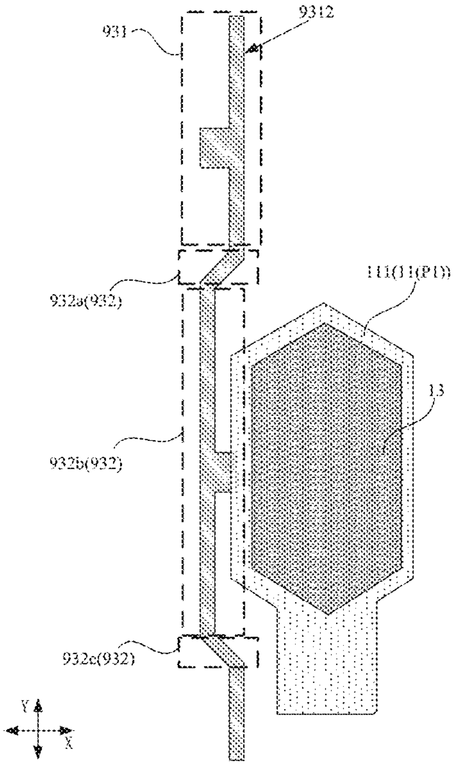
FIG. 9B is another structural diagram of an anode and a signal line, in accordance with some embodiments.
Figure 9C:
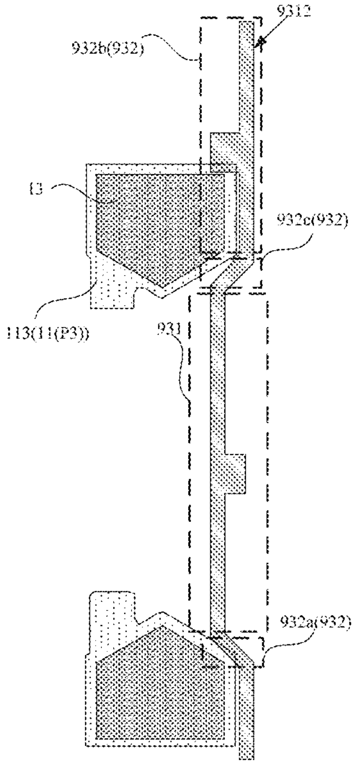
FIG. 9C is yet another structural diagram of an anode and a signal line, in accordance with some embodiments.

As shown in FIGS. 9A to 9C, in some embodiments, in a case where the orthographic projection(s) S of the at least one of the plurality of anodes 11 on the substrate 1 are non-overlapped with the orthographic projection of each first signal line 93 on the substrate 1, each of at least one first signal line 93 includes at least one straight portion 931 and at least one bent portion 932 that are alternately arranged. The straight portion 931 extends in the first direction Y, and an orthographic projection of the straight portion 931 on the substrate 1 is located on a side of an orthographic projection of an anode 11 on the substrate 1 in the first direction Y. The bent portion 932 includes a first segment 932*a*, a second segment 932*b* and a third segment 932*c* connected in sequence. The second segment 932*b* extends in the first direction Y, and an orthographic projection of the second segment 932*b* on the substrate 1 is located on a side of the orthographic projection of the anode 11 in the second direction X, so as to avoid the orthographic projection S of the anode 11. The second direction X is perpendicular to the first direction Y.

In some embodiments, as shown in FIGS. 9A and 12, in an example where each of the at least one anode 11 is a second anode 112, and each of the at least one first signal line 93 is a first data line 9311, the second anode 112 is adjacent to and electrically connected to the first data line 9311. A straight portion 931 of the first data line 9311 extends in the first direction Y, and an orthographic projection of the straight portion 931 of the first data line 9311 on the substrate 1 is located on a side of an orthographic projection of the second anode 112 on the substrate 1 in the first direction Y. Since in a first anode column and a second anode column that are adjacent to each other, first anodes 111 and second anodes 112 are staggered, the orthographic projection of the straight portion 931 of the first data line 9311 on the substrate 1 is located on the side of the orthographic projection S of the second anode 112 in the first direction Y, i.e., the straight portion 931 of the first data line 9311 is received in a region between two adjacent second anodes 112 to avoid the first anode 111, so that the straight portion 931 of the first data line 9311 is prevented from being overlapped with the first anode 111. An orthographic projection of a bent portion 932 of the first data line 9311 on the substrate 1 follows a boundary of the orthographic projection S of the second anode 112 around, so as to avoid the orthographic projection S of the second anode 112. In this way, the second anode 112 is ensured to be non-overlapped with the first data line 9311.

For example, a first segment 932*a* of the bent portion 932 of the first data line 9311 is connected to the straight portion 931 of the first data line 9311 located on the side of the second anode 112 in the first direction Y. A third segment 932*c* of the bent portion 932 of the first data line 9311 is connected to a straight portion 931 of the first data line 9311 located on another side of the second anode 112 in the first direction Y. A second segment 932*b* of the bent portion 932 of the first data line 9311 extends in the first direction Y, and connects the first segment 932*a* and the third segment 932*c*. An orthographic projection of the second segment 932*b* on the substrate is located on a side of the orthographic projection of the second anode 112 in the second direction X, so that the first data line 9311 avoids the orthographic projection S of the second anode 112.

As a possible design, referring to FIG. 12 again, the first data line 9311 includes a plurality of straight portions 931 and a plurality of bent portions 932 that are alternately arranged. The first data line 9311 is located between a first anode column and a second anode column that are adjacent to each other. An orthographic projection of each straight portion 931 of the first data line 9311 on the substrate 1 is located on a side, in the second direction X, of an orthographic projection S of a first anode 111 in the first anode column on the substrate 1, and is located on a side, in the first direction Y, of an orthographic projection S of a second anode 112 in the second anode column on the substrate 1. An orthographic projection S, on the substrate 1, of a second segment 932*b* of each bent portion 932 of the first data line 9311 is located on a side, in the second direction X, of an orthographic projection S of a second anode 112 in the second anode column on the substrate 1, so as to avoid the orthographic projection S of the second anode 112.

For example, as shown in FIG. 8A, see a structure in which a first signal line 93 from left to right is disposed at an initial arrangement position. In some examples, referring to FIG. 12 again, in an example where the anode 11 is a second anode 112, see a first signal line 93 from left to right. The first signal line 93 is moved to the right by an appropriate amount in the second direction X with respect to the initial arrangement position, and a portion of the first signal line 93 is bent, so as to avoid the orthographic projection S of the second anode 112, so that the structure with straight portion(s) 931 and bent portion(s) 932 is formed. An orthographic projection of the straight portion 931 of the first signal line 93 on the substrate 1 is located on a side of an orthographic projection S of a second anode 112 on the substrate 1 in the first direction Y. An orthographic projection of the bent portion 932 of the first signal line 93 on the substrate 1 follows a boundary of the orthographic projection of the second anode 112 around, so as to avoid the orthographic projection of the second anode 112. For example, as shown in FIG. 9A, the shape of the second anode 112 is a hexagon, and extending directions of a first segment 932*a*, a second segment 932*b* and a third segment 932*c* of the bent portion 932 of the first signal line 93 are respectively matched with three left boundaries of the hexagon.

In some other examples, as shown in FIGS. 9C and 11, in an example where each of the at least one anode 11 is a third anode 113, and each of the at least one first signal line 93 is a second data line 9312, the third anode 113 is adjacent to and electrically connected to the second data line 9312. A straight portion 931 of the second data line 9312 extends in the first direction Y, and an orthographic projection of the straight portion 931 of the second data line 9312 on the substrate 1 is located on a side of an orthographic projection S of the third anode 113 on the substrate 1 in the first direction Y. Since in a third anode column and a first anode column that are adjacent to each other, third anodes 113 and first anodes 111 are staggered, the orthographic projection of the straight portion 931 of the second data line 9312 on the substrate 1 is located on the side of the orthographic projection S of the third anode 113 in the first direction Y, i.e., the straight portion 931 of the second data line 9312 is received in a region between two adjacent third anodes 113 to avoid the first anode 111, so that the straight portion 931 of the second data line 9312 is prevented from being overlapped with the first anode 111. An orthographic projection of a second segment 932*b* of a bent portion 932 of the second data line 9312 on the substrate 1 follows a boundary of the orthographic projection S of the third anode 113 around, so as to avoid the orthographic projection S of the third anode 113. In this way, the third anode 113 is ensured to be non-overlapped with the second data line 9312. For example, as shown in FIG. 9C, the shape of the third anode 113 is a pentagon, and extending directions of the second segment 932*b* and the third segment 932*c* (or the second segment 932*b* and the first segment 932*a*) of the bent portion 932 of the first signal line 93 are respectively matched with two right boundaries of the pentagon.

As a possible design, referring to FIG. 11 again, the first signal line 93 is the second data line 9312, and the second data line 9312 includes a plurality of straight portions 931 and a plurality of bent portions 932 that are alternately arranged. The second data line 9312 is located between a third anode column and a first anode column that are adjacent to each other. An orthographic projection of each straight portion 931 of the second data line 9312 on the substrate 1 is located on a side, in the second direction X, of an orthographic projection S of a first anode 111 in the first anode column, and is located on a side, in the first direction Y, of an orthographic projection S of a third anode 113 in the third anode column on the substrate 1. An orthographic projection of a second segment 932*b* of each bent portion 932 of the second data line 9312 on the substrate 1 is located on a side, in the second direction X, of an orthographic projection S of a third anode 113 in the third anode column on the substrate 1, so as to avoid the orthographic projection S of the third anode 113. For example, the second segment 932*b* of each bent portion 932 of the second data line 9312 corresponds to a third anode 113 in the third anode column to avoid an orthographic projection S of each third anode 11 on the substrate 1, so that an orthographic projection of the second data line 9312 on the substrate 1 is non-overlapped with an orthographic projection of each third anode 113 on the substrate 1.

As shown in FIG. 8A, see a structure in which a second first signal line 93 and a fourth first signal line 93 from left to right are disposed at respective initial arrangement positions. For example, referring to FIG. 11 again, in an example where the anode 11 is a certain third anode 113, see a second first signal line 93 and a fourth first signal line 93 from left to right. The second first signal line 93 is moved to the left by an appropriate amount in the second direction X with respect to the initial arrangement position, and a portion of the second first signal line 93 is bent, so as to avoid the orthographic projection S of the third anode 113, so that the structure with straight portion(s) 931 and bent portion(s) 932 is formed. A changing process of the fourth first signal line 93 is the same as that of the second first signal line 93, and will not be repeated here. The second first signal line 93 and the fourth first signal line 93 are second data lines 9312. An orthographic projection of each straight portion 931 of the second data line 9312 on the substrate 1 is located on a side, in the second direction X, of an orthographic projection S of a first anode 111 in a first anode column on the substrate 1, and is located on a side, in the first direction Y, of an orthographic projection S of a third anode 113 in a third anode column on the substrate 1. An orthographic projection of a second segment 932*b* of each bent portion 932 of the second data line 9312 on the substrate 1 is located on a side, in the second direction X, of orthographic projection(s) S of at least one third anode 113 in the third anode column on the substrate 1, so as to avoid the orthographic projection(s) S of the third anode(s) 113. For example, as shown in FIG. 11, the shape of the third anode 113 is a pentagon, and extending directions of the second segment 932*b* and the third segment 932*c* (or the second segment 932*b* and the first segment 932*a*) of the bent portion 932 of the first signal line 93 are respectively matched with two right boundaries of the pentagon, thereby avoiding the orthographic projection S of the third anode 113.

For example, referring to FIG. 11 again, in third anodes 113 in a third anode column, every two adjacent third anodes 113 are divided into a group, and in the first direction Y, a distance between two third anodes 113 in each group of third anodes 113 is less than a distance between an entirety of the two third anodes 113 and other surrounding third anode 113. For example, as shown in FIG. 11, the shape of the third anode 113 is a pentagon. In every two adjacent third anodes 113, an edge of a third anode 113 is opposite to and parallel to an edge of another third anode 113, and the two third anodes 113 serve as a group of third anodes 113.

It will be noted that the division of the group of third anodes 113 is convenient for describing a positional relationship between the orthographic projections S of the third anodes 113 on the substrate and the orthographic projection of the first signal line 93 on the substrate 1, and the group of third anodes 113 is not limited to be located in a same pixel P'.

For example, considering a group of third anodes 113 as an example, the shape of the third anode 113 is a pentagon, and respective edges of two third anodes 113 that are parallel to each other are opposite to each other. In a case where the first signal line 93 is a second data line 9312, an orthographic projection of each straight portion 931 of the second data line 9312 on the substrate 1 is located on a side of an orthographic projection of a group of third anodes 113 on the substrate 1 in the first direction Y. An orthographic projection of a second segment 932*b* of each bent portion 932 of the second data line 9312 on the substrate 1 is located on a side of an orthographic projection S of a group of third anodes 113 on the substrate 1 in the second direction X, so as to avoid the orthographic projection S of the group of third anodes 113 on the substrate 1.

It can be understood that in a case where the third anode 113 is an anode corresponding to a green sub-pixel, two third anodes 113 with a small area are used. For example, the first anode 111 is an anode corresponding to a red sub-pixel, and the second anode 112 is an anode corresponding to a blue sub-pixel. An area of the third anode 113 is less than an area of the first anode 111, and the area of the first anode 111 is less than an area of the second anode 112. In this way, the area of the third anode 113 is minimized. This is because the light-emitting functional layer in the green sub-pixel has a highest luminous efficiency, and a color shift problem caused by different luminous efficiencies of red, green and blue sub-pixels may be solved by such a design.

In some other examples, as shown in FIG. 9B, in an example where each of the at least one anode 11 is a first anode 111, and each of the at least one first signal line 93 is a second data line 9312, the first anode 111 is adjacent to the second data line 9312. A straight portion 931 of the second data line 9312 extends in the first direction Y, and an orthographic projection of the straight portion 931 of the second data line 9312 on the substrate 1 is located on a side of an orthographic projection S of the first anode 111 on the substrate 1 in the first direction Y. An orthographic projection of a bent portion 932 of the second data line 9312 on the substrate 1 follows a boundary of the orthographic projection S of the first anode 111. The bent portion 932 of the second data line 9312 includes a first segment 932*a*, a second segment 932*b* and a third segment 932*c* connected in sequence. The second segment 932*b* extends in the first direction Y, and an orthographic projection of the second segment 932*b* on the substrate 1 is located on a side of the orthographic projection of the first anode 111 in the second direction X, so as to avoid the orthographic projection S of the first anode 111.

Referring to FIGS. 9C and 9B again, it can be understood that considering different wiring structures, for a same second data line 9312, an orthographic projection of the second data line 9312 on the substrate avoids orthographic projections of a third anode 113 and a first anode 111 that are respectively located on two sides of the second data line 9312 on the substrate. The second segment 932*b* of the bent portion 932 of the second data line 9312 relative to the first anode 111 in FIG. 9B may also serve as the straight portion 931 of the third anode 113 in FIG. 9C. In this way, the second data line 9312 is located between a third anode column and a first anode column that are adjacent to each other. Although the second data line 9312 finally presents the same shape, the second data line 9312 is bent to different positions in different directions based on the second data line 9312 in an initial state.

In some embodiments, as shown in FIG. 12, each first signal line 93 includes a plurality of straight portions 931 and a plurality of bent portions 932. According to the periodic arrangement of the plurality of anodes, the structure of the first signal line 93 is also periodic. The at least one first signal line 93 includes a first data line 9311 and a second data line 9312. The first data line 9311 is located between a first anode column and a second anode column that are adjacent to each other. The second data line 9312 is located between a third anode column and a first anode column that are adjacent to each other.

The first data line 9311 includes a plurality of straight portions 931 and a plurality of bent portions 932. An orthographic projection of each straight portion 931 of the first data line 9311 on the substrate 1 is located on a side, in the second direction, of an orthographic projection S of a first anode 111 in the first anode column X on the substrate 1, and is located on a side, in the first direction Y, of an orthographic projection S of a second anode 112 in the second anode column on the substrate 1. An orthographic projection S of a second segment of each bent portion 932 of the first data line 9311 on the substrate 1 is located on a side, in the second direction X, of an orthographic projection S of a second anode 112 in the second anode column on the substrate 1, so as to avoid the orthographic projection of the second anode 112.

The second data line 9312 includes a plurality of straight portions and a plurality of bent portions. An orthographic projection of each straight portion 931 of the second data line 9312 on the substrate 1 is located on a side, in the second direction X, of an orthographic projection S of a first anode 111 in the first anode column on the substrate 1, and is located on a side, in the first direction Y, of an orthographic projection of a third anode 113 in the third anode column on the substrate 1. An orthographic projection of a second segment of each bent portion 932 of the second data line 9312 on the substrate 1 is located on a side, in the second direction X, of orthographic projection(s) of at least one third anode 113 in the third anode column on the substrate 1, so as to avoid the orthographic projection(s) S of the third anode(s) 113.

As shown in FIG. 8A, see the structure in which the first signal line 93 and the second first signal line 93 from left to right are disposed at respective initial arrangement positions. Referring to FIG. 12 again, changing processes of respective arrangement positions of the first signal line 93 and the second first signal line 93 from left to right with respect to the respective initial arrangement positions refer to the above two examples for details, and will not be repeated here.

In this way, the first conductive layer 9 has no signal line pattern in a region corresponding to the orthographic projection S of the anode 11, which ensures that a plane where a region of the first planarization layer 10 corresponding to the orthographic projection S of the anode 11 is located is horizontal, and a plane where the anode 11 in this region is located is also horizontal. Thus, a different distance from light emitted from the light-emitting device 02 under a joint action of the anode 11, the light-emitting functional layer 13 and the cathode layer 14 to a display position, due to a fact that the anode 11 is not flat or has a pretilt angle, is avoided, and an uneven display brightness of the exit light caused by the different distance is avoided, thereby avoiding color shift of a display image. Moreover, when the light emitted from the light-emitting functional layer 13 is irradiated onto the anode 11, and the anode 11 reflects the light, a different path length of the reflected light due to the fact that the anode 11 is not flat or has a pretilt angle is avoided, and an uneven reflection of the exit light caused by the different path length is avoided, thereby avoiding color shift of the display image. As shown in FIGS. 9A to 12, the first signal line 93 does not affect a horizontal effect of a plane where the third anode 113 corresponding to the third sub-pixel P3 is located, and also does not affect a horizontal effect of a plane where the second anode 112 corresponding to the second sub-pixel P2 is located, so that the second anode 112 and the third anode 113 are prevented from being "inclined", thereby avoiding affecting the light-emitting effect.

As shown in FIGS. 11 and 12, in the second direction X, a vertical distance L1 between the second segment of the bent portion 932 and the straight portion 931 of the first signal line is in a range of 1 μm to 10 μm. The second direction X is perpendicular to the first direction Y. For example, the vertical distance L1 between the bent portion 932 and the straight portion 931 is 1 μm, 6 μm or 10 μm. A bending degree of the first signal line 93 is set according to a distance L2 between two adjacent first signal lines 93 in the second direction X and positions and areas of the orthographic projections S of the anodes, thereby ensuring that each first signal line 93 is able to be coupled to anodes 11 in corresponding sub-pixels P, and a difficulty of the manufacturing process is reduced.

As shown in FIGS. 13 to 17, in some embodiments, the orthographic projection(s) S of the at least one of the plurality of anodes 11 on the substrate 1 are each overlapped with the orthographic projection(s) of the at least one first signal line 93 on the substrate 1. The orthographic projection (s) S of the at least one anode 11 on the substrate 1 are each overlapped with an orthographic projection of a first signal line 93 on the substrate 1. Alternatively, the orthographic projection(s) S of the at least one anode 11 on the substrate 1 are each overlapped with orthographic projections of first signal lines 93 on the substrate 1.

Figure 13:
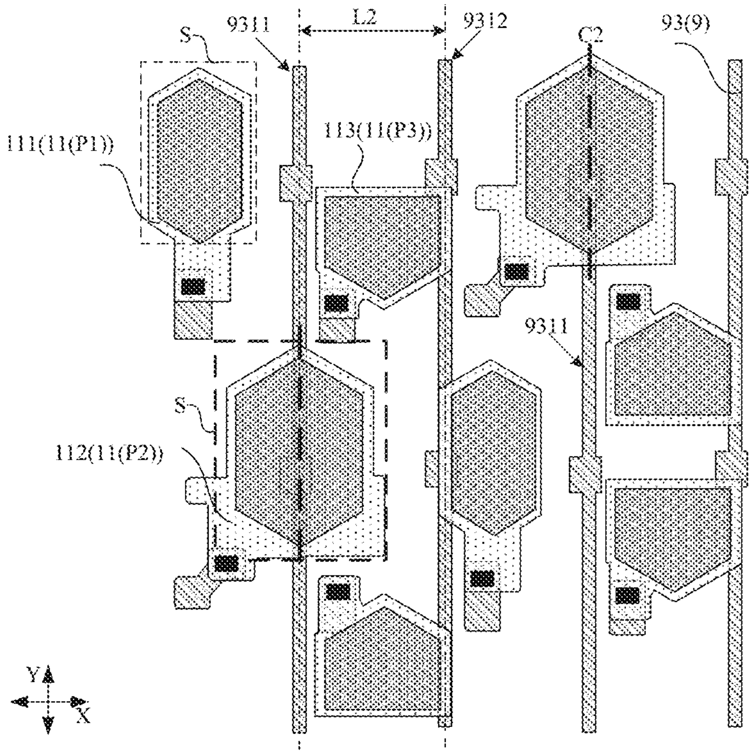
FIG. 13 is a diagram showing yet another film layer structure of a display substrate, in accordance with some embodiments.
Figure 14:
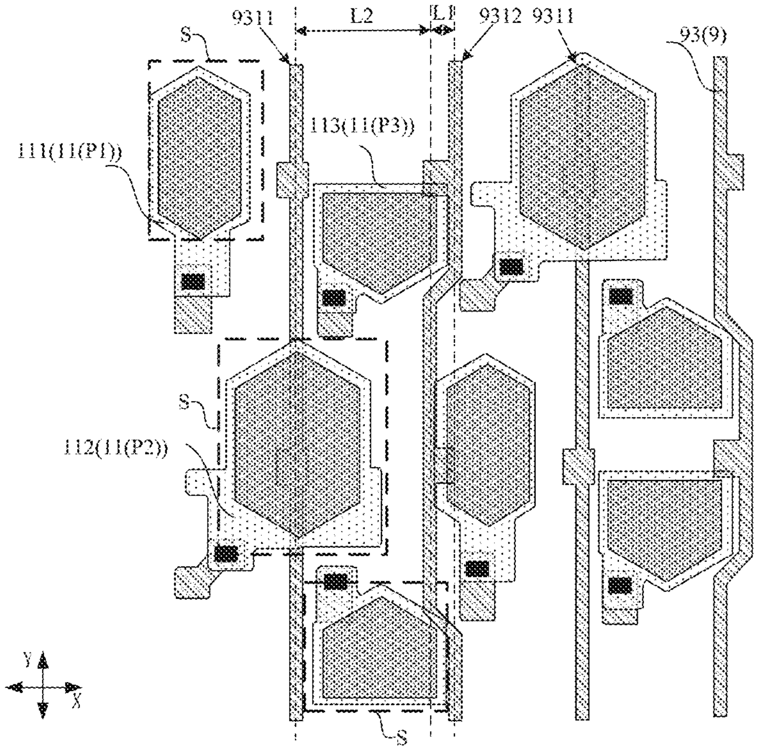
FIG. 14 is a diagram showing yet another film layer structure of a display substrate, in accordance with some embodiments.

As shown in FIGS. 3, 13 and 14, in some embodiments, the orthographic projection(s) S of the at least one anode 11 are each overlapped with the orthographic projection of the first signal line 93. A setting portion O of the anode 11 that the first signal line 93 crosses coincides with the center line C of the anode 11 in the first direction Y. A portion of the orthographic projection of the first signal line 93 coincides with a center line C, in the first direction Y, of the orthographic projection S of the anode 11 on the substrate 1.

For example, in the at least one first signal line 93 whose orthographic projection(s) on the substrate 1 are overlapped with the orthographic projection of the anode 11, a portion, located outside the orthographic projection of the anode 11, of the orthographic projection of each of the at least one first signal line 93 on the substrate 1 is non-overlapped with orthographic projections, on the substrate 1, of other anodes 11 adjacent to the anode 11 in the plurality of anodes 11.

For example, as shown in FIGS. 10D, 13 and 14, in an example where the anode 11 is a second anode 112, and the first signal line 93 is a first data line 9311, the first data line 9311 is a first data line 9311 or a third first data line 9311 from left to right in FIG. 13. A portion of an orthographic projection of the first data line 9311 on the substrate 1 coincides with a center line C2, in the first direction Y, of an orthographic projection S of the second anode 112 on the substrate 1, so that the center line C2 of the second anode 112 in the first direction Y is an axis of symmetry, and heights of the second anode 112 at positions symmetrical about the axis of symmetry are substantially equal.

As shown in FIGS. 13 and 14, other anodes 11 in the plurality of anodes 11 that are adjacent to the second anode 112 are other anodes around the second anode 112, including other types of anodes located on two sides of the second anode 112 in the second direction and other types of anodes located on two sides of the second anode 112 in the first direction, such as first anodes in a first anode column located on a left side of the second anode 112 and third anodes in a third anode column located on a right side of the second anode 112.

In an example each of the at least one anode 11 is a second anode 12, the orthographic projection(s) of the at least one first signal line 93 on the substrate 1 are overlapped with orthographic projections of second anodes 112 on the substrate 1, and the orthographic projection(s) of the first signal line(s) 93 on the substrate 1 are non-overlapped with orthographic projections of the plurality of first anodes 111 and the plurality of third anodes 113 on the substrate 1. For example, an orthographic projection of a first signal line 93 at the left side in FIG. 13 or 14, on the substrate 1 is overlapped with orthographic projections of second anodes 112 in the first direction Y on the substrate 1, and center lines C2, in the first direction Y, of the orthographic projections S of the second anodes 112 on the substrate 1 each coincide with a respective portion of the orthographic projection of the first signal line 93 on the substrate 1. In this case, the orthographic projection of the first signal line 93 is non-overlapped with orthographic projections of first anodes 111 located on a left side of the second anodes 112 on the substrate 1, and is non-overlapped with orthographic projections of third anodes 113 located on a right side of the second anodes 112 on the substrate 1.

In some embodiments, center lines C2, in the first direction Y, of orthographic projections S of second anodes 112 included in a second anode column on the substrate 1 each coincide with a respective portion of an orthographic projection of a first data line 9311 on the substrate 1, so that by taking the center line C2 of the second anode in the first direction Y as an axis of symmetry, heights of each second anode 112 included in the second anode column at positions symmetrical about the axis of symmetry are substantially equal. As shown by the left anode 11 in FIG. 3, the height H1 of the left position M of the second anode column is substantially equal to the height H2 of the right position N of the second anode column, and a plane where the second anode column is located is horizontal. Thus, a surface of a portion of the first planarization layer 10 corresponding to the orthographic projection S of the second anode 112 tends to be horizontal without large inclination, thereby avoiding the color shift of the display image.

As shown in FIGS. 4 and 13 to 17, in yet other embodiments, the orthographic projection(s) of the at least one anode 111 are each overlapped with the orthographic projections of the first signal lines 93, and setting portions O of the anode 11 that the first signal lines 93 respectively cross are symmetrical about the center line C of the anode 11 in the first direction Y. For example, the number of the first signal lines 93 is two.

In some examples, as shown in FIG. 15, the orthographic projection(s) S of the at least one anode 11 are each overlapped with orthographic projections of two first signal lines 93 on the substrate 1, and the two first signal lines 93 are respectively a first data line 9311 and a second data line 9312 corresponding to a first anode column, a second anode column and a third anode column that are adjacent.

Figure 10A:
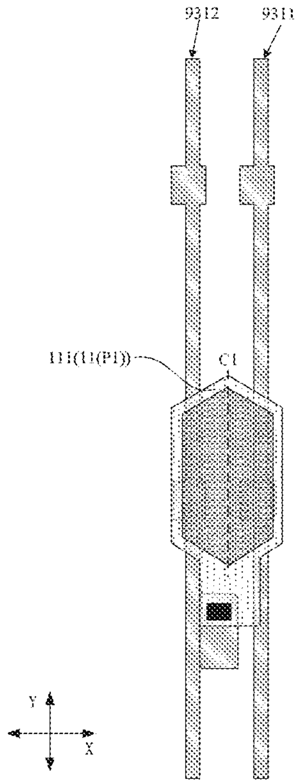
FIG. 10A is yet another structural diagram of an anode and signal lines, in accordance with some embodiments.

As shown in FIG. 10A, in the example where the anode 11 is a first anode 111, portions of the first anode 111 that the first data line 9311 and the second data line 9312 respectively cross are symmetrical about a center line C1 of the first anode 111 in the first direction Y. Thus, by taking the center line C1 of the first anode 111 in the first direction Y as an axis of symmetry, heights of the first anode 111 at symmetrical positions are substantially equal.

Figure 10B:
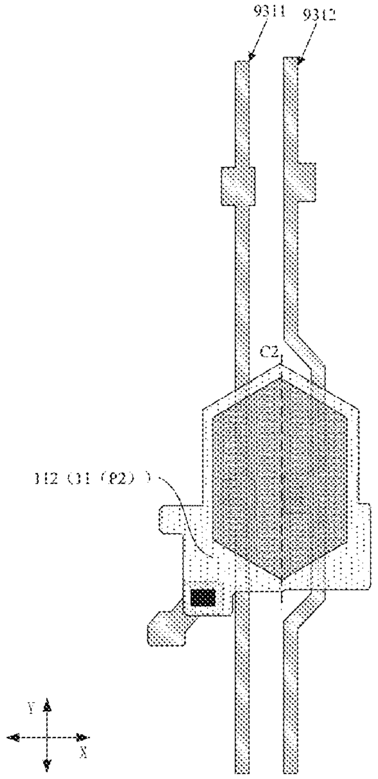
FIG. 10B is yet another structural diagram of an anode and signal lines, in accordance with some embodiments.

As shown in FIG. 10B, in an example where the anode 11 is a second anode 112, portions of the second anode 112 that the first data line 9311 and the second data line 9312 respectively cross are symmetrical about a center line C2 of the second anode 112 in the first direction Y. Thus, by taking the center line C2 of the second anode 112 in the first direction Y as an axis of symmetry, heights of the second anode 112 at symmetrical positions are substantially equal.

Figure 10C:
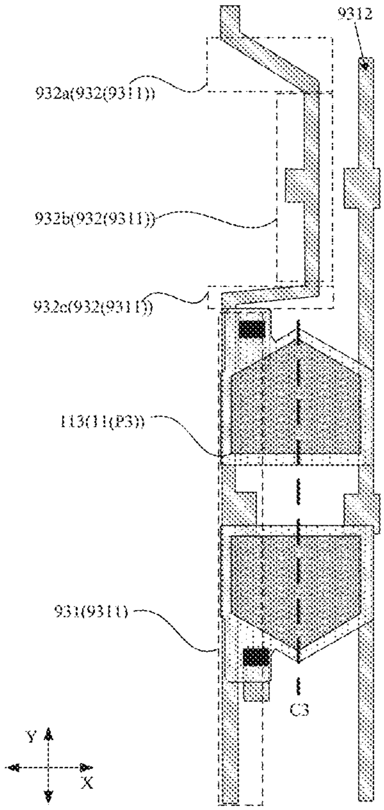
FIG. 10C is yet another structural diagram of anodes and signal lines, in accordance with some embodiments.
Figure 10D:
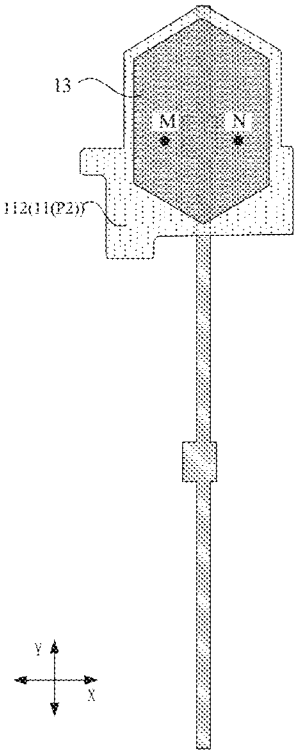
FIG. 10D is yet another structural diagram of an anode and a signal line, in accordance with some embodiments.

As shown in FIG. 10C, in an example where the anode 11 is a third anode 113, portions of the third anode 113 that the first data line 9311 and the second data line 9312 respectively cross are symmetrical about a center line C3 of the third anode 113 in the first direction Y. Thus, by taking the center line C3 of the third anode 113 in the first direction Y as an axis of symmetry, heights of the third anode 113 at symmetrical positions are substantially equal.

For example, referring to FIG. 15 again, orthographic projections of the first data line 9311 and the second data line 9312 on the substrate1 are each overlapped with orthographic projections of third anodes 113 included in a third anode column on the substrate1, and portions of each third anode 113 that the first data line 9311 and the second data line 9312 respectively cross are symmetrical about a center line C3 of this third anode 113 in the first direction Y. Thus, by taking the center line C3 of the third anode in the first direction Y as an axis of symmetry, heights of each third anode 113 included in the third anode column at symmetrical positions are substantially equal.

Figure 16:
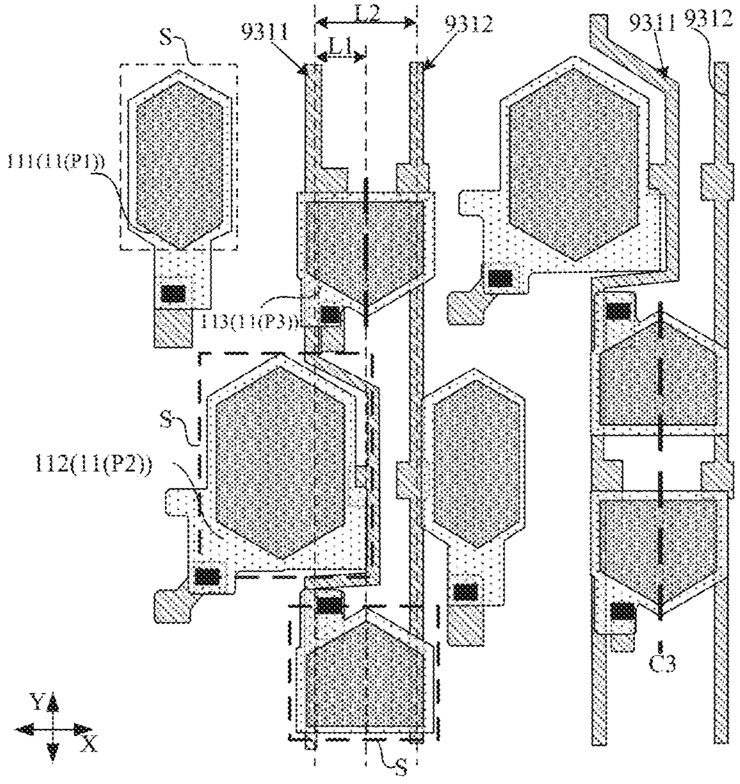
FIG. 16 is a diagram showing yet another film layer structure of a display substrate, in accordance with some embodiments.

In yet other examples, as shown in FIG. 16, in the example where the anode 11 is a third anode 113, the two first signal lines 93 are a first data line 9311 and a first second data line 9312 from left to right. A portion, corresponding to the third anode 113, of an orthographic projection of the first first data line 9311 on the substrate 1 and a portion, corresponding to the third anode 113, of an orthographic projection of the first second data line 9312 on the substrate 1 are symmetrical about a center line C3, in the first direction Y, of an orthographic projection of the third anode 113 on the substrate 1. Moreover, the orthographic projection of the first second data line 9312 is non-overlapped with orthographic projections S of first anodes 111 adjacent to the first second data line 9312 on the substrate 1, and the orthographic projection of the first first data line 9311 is non-overlapped with orthographic projections S of second anodes 112 adjacent to the first first data line 9311 on the substrate 1.

For example, referring to FIG. 16 again, in the example where the anode 11 is a third anode 113, the two first signal lines 93 are a second first data line 9311 and a second data line 9312 from left to right. A portion, corresponding to the third anode 113, of an orthographic projection of the second first data line 9311 on the substrate 1 and a portion, corresponding to the third anode 113, of an orthographic projection of the second data line 9312 on the substrate 1 are symmetrical about a center line C3, in the first direction Y, of an orthographic projection of the third anode 113 on the substrate 1. Moreover, the orthographic projection of the second first data line 9311 is non-overlapped with orthographic projections of second anodes 112 adjacent to the second first data line 9311 on the substrate 1. For example, as shown in FIGS. 10C and 16, the shape of the second anode 112 is a hexagon, and extending directions of a first segment 932*a*, a second segment 932*b* and a third segment 932*c* of a bent portion 932 of the second first data line 9311 are respectively matched with three right boundaries of the hexagon, so as to avoid the orthographic projection S of the second anode 112, thereby ensuring that the orthographic projection of the second anode 112 is non-overlapped with the orthographic projection of the second first data line 9311. The orthographic projection of the second data line 9312 is non-overlapped with orthographic projections S of first anodes 111 adjacent to the second data line 9312 on the substrate 1.

Figure 17:
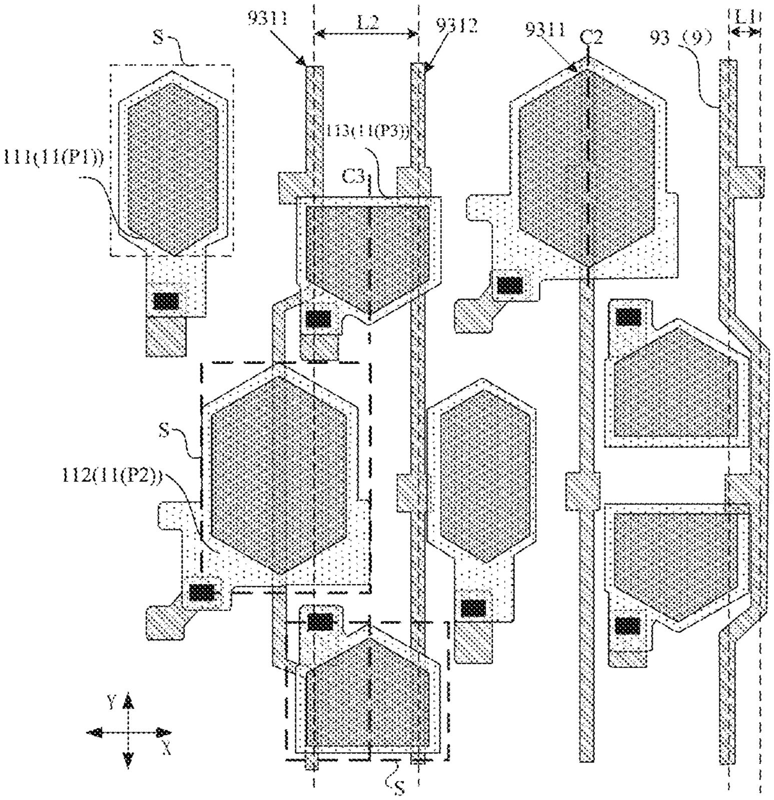
FIG. 17 is a diagram showing yet another film layer structure of a display substrate, in accordance with some embodiments.

In yet other embodiments, as shown in FIG. 17, an orthographic projection of the second data line 9312 on the substrate 1 is non-overlapped with orthographic projections S of first anodes 111 adjacent to the second data line 9312 on the substrate 1. Moreover, an orthographic projection of the first data line 9311 on the substrate 1 is overlapped with orthographic projections S of second anodes 112 adjacent to the first data line 9311 on the substrate 1, and overlapping portions of the orthographic projection of the first data line 9311 respectively coincide with the center lines C2 of the orthographic projections of the second anodes 112 in the first direction Y.

For example, referring to FIG. 17 again, in the example where the anode 11 is a third anode 113, the two first signal lines 93 are a first first data line 9311 and a first second data line 9312 from left to right. A portion, corresponding to the third anode 113, of an orthographic projection of the first first data line 9311 on the substrate 1 and a portion, corresponding to the third anode 113, of an orthographic projection of the first second data line 9312 on the substrate 1 are symmetrical about a center line C3, in the first direction Y, of an orthographic projection of the third anode 113 on the substrate 1. Moreover, the orthographic projection of the first first data line 9311 is overlapped with orthographic projections of second anodes 112 adjacent to the first first data line 9311 on the substrate 1, and overlapping portions of the orthographic projection of the first first data line 9311 respectively coincide with the center lines C2 of the orthographic projections of the second anodes 112 in the first direction Y. The orthographic projection of the first second data line 9312 is non-overlapped with orthographic projections S of first anodes 111 adjacent to the first second data line 9312 on the substrate 1.

Thus, a plane where a surface of a portion, corresponding to the orthographic projection S of the anode, of the first planarization layer 10 is located is horizontal, thereby avoiding the color shift of the display image due to the fact that the plurality of anodes 11 located on the first planarization layer 10 have a pretilt angle or are not flat.

It can be understood that a first signal line 93 in the plurality of first signal lines 93 may extend in the first direction Y, and an orthographic projection of this first signal line 93 on the substrate 1 is non-overlapped the orthographic projection S of the anode. The extension of each of the plurality of first signal lines 93 may be any one or combination of the above embodiments, as long as a plane where the plurality of anodes 11 are located is horizontal.

In the above embodiments, as shown in FIGS. 11 to 17, in the second direction X, the distance L2 between two adjacent first signal lines 93 is in a range of 5 μm to 30 μm. For example, regardless of the straight portion 931 or the bent portion 932 of the first signal line 93, the distance between two adjacent signal lines 93 is 5 μm, 15 μm or 30 μm, so as to ensure the effective signal transmission of the first signal line 93 and avoid signal interference.

In some embodiments, as shown in FIGS. 7C and 26, each pixel circuit 200 includes at least the compensation transistor T2, the driving transistor T3 and the capacitor 01.

As shown in FIGS. 18 and 26, the first electrode region T21 of the compensation transistor T2 is electrically connected to the second electrode region T32 of the driving transistor T3. As shown in FIGS. 21 and 26, the second electrode region T22 of the compensation transistor T2 is electrically connected to the gate of the driving transistor T3 (i.e., the portion of the first electrode plate 011 of the capacitor 01 whose orthographic projection on the substrate 1 is overlapped with the orthographic projection of the channel region T33 of T3 on the substrate 1) through the connection structure 92'. For example, the connection structure 92' is located in the second conductive layer 9'. An end of the connection structure 92' is electrically connected to the second electrode region T22 of the compensation transistor T2 through a first via, and the first via penetrates to the semiconductor layer 3. Another end of the connection structure 92' is electrically connected to the gate of the driving transistor T3 (i.e., the portion of the first electrode plate 011 of the capacitor 01 whose orthographic projection on the substrate 1 is overlapped with the orthographic projection of the channel region T33 of T3 on the substrate 1) through a second via, and the second via penetrates to the first gate metal layer 5.

For example, as shown in FIGS. 24 and 25, an orthographic projection of each second anode 112 on the substrate 1 is overlapped with orthographic projections, on the substrate 1, of connection structures 92' in two adjacent pixel circuits 200 (see the dashed ellipse regions in FIG. 24). Moreover, one of the two adjacent pixel circuits 200 is a second pixel circuit 202 electrically connected to the second anode 112, and another one of the two adjacent pixel circuits 200 is a third pixel circuit 203 adjacent to the second pixel circuit. As shown in FIG. 7C, the connection structure 92' corresponds to the first node N1 in the equivalent circuit diagram. By expanding the shape of the second anode 112, the second anode 112 shields the connection structures 92' in the two adjacent pixel circuits 200 to stabilize the voltage of the first node N1.

In some embodiments, as shown in FIGS. 24 to 26, an orthographic projection of each data line on the substrate 1 is overlapped with orthographic projections, on the substrate 1, of second electrode plates 012 of capacitors 01 in pixel circuits 200 in a pixel circuit column to which this data line is electrically connected. For example, as shown in FIGS. 25 and 26, a first data line 9311 is electrically connected to a first pixel circuit column 210. The first pixel circuit column 210 includes first pixel circuits 201 and second pixel circuits 202. An orthographic projection of the first data line 9311 on the substrate 1 is overlapped with orthographic projections, on the substrate 1, of second electrode plates 012 of capacitors 01 in the first pixel circuits 201, and is overlapped with orthographic projections, on the substrate 1, of second electrode plates 012 of capacitors 01 in the second pixel circuits 202 (see the dashed triangle regions in FIGS. 24 and 26). A second data line 9312 is electrically connected to a second pixel circuit column 220, and orthographic projection of the second data line 9312 on the substrate 1 is overlapped with orthographic projections, on the substrate 1, of second electrode plates 012 of capacitors 01 in second pixel circuits 202 in the second pixel circuit column 220 (see the dashed triangle regions in FIGS. 24 and 26).

Since the second electrode plates 012 of the capacitors 01 in the plurality of pixel circuits 200 are electrically connected to the plurality of voltage signal lines to receive respective constant voltage signals, the orthographic projection of the data line is overlapped with the orthographic projections of the second electrodes 012 of the capacitors 01 in the pixel circuit column, so that the data signal transmitted by the data line may be stabilized, thereby avoiding fluctuation of the data signal due to interference of other factors.

The foregoing descriptions are only specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display substrate, comprising:

a substrate;

a first conductive layer disposed on a side of the substrate, the first conductive layer including a plurality of first signal lines extending in a first direction, the plurality of first signal lines including a plurality of data lines;

a first planarization layer disposed on a side of the first conductive layer away from the substrate;

a plurality of anodes disposed on a side of the first planarization layer away from the substrate; and a plurality of pixel circuits, each pixel circuit being electrically connected to an anode of the plurality of anodes;

wherein the first conductive layer is a conductive layer located between the substrate and the plurality of anodes and closest to the plurality of anodes; wherein an orthographic projection of at least one of the plurality of anodes on the substrate is non-overlapped with an orthographic projection of each first signal line on the substrate; and/or an orthographic projection of at least one of the plurality of anodes on the substrate is overlapped with an orthographic projection of one or more first signal lines on the substrate; in an anode and at least one first signal line whose orthographic projections on the substrate are overlapped, the at least one first signal line crosses a setting portion of the anode, so that by taking a center line of the anode in the first direction as an axis of symmetry, heights of the anode at symmetrical positions are substantially equal, wherein the at least one first signal line includes a single first signal line, and the orthographic projection of the anode on the substrate is overlapped with an orthographic projection of the first signal line on the substrate; a setting portion of the anode that the first signal line crosses coincides with the center line of the anode in the first direction; or the at least one first signal line includes at least two first signal lines, and the orthographic projection of the anode on the substrate is overlapped with orthographic projections of the at least two first signal lines on the substrate; and setting portions of the anode that the at least two first signal lines respectively cross are symmetrical about the center line of the anode in the first direction.

2. The display substrate according to claim 1, wherein in a case where the orthographic projection of the at least one of the plurality of anodes on the substrate is non-overlapped with the orthographic projection of each first signal line on the substrate, at least one first signal line includes at least one straight portion and at least one bent portion that are alternately arranged; wherein a straight portion in the at least one straight portion extends in the first direction, and an orthographic projection of the straight portion on the substrate is located on a side of an orthographic projection of a corresponding anode on the substrate in the first direction; and a bent portion in the at least one bent portion includes a first segment, a second segment and a third segment connected in sequence; the second segment extends in the first direction, and an orthographic projection of the second segment on the substrate is located on a side of the orthographic projection of the corresponding anode on the substrate in a second direction; the first segment is connected to the straight portion adjacent to the first segment, and the third segment is connected to another straight portion adjacent to the third segment;

wherein the second direction is perpendicular to the first direction.

3. The display substrate according to claim 2, wherein in the second direction, a distance between the second segment of the bent portion and the straight portion is in a range of 1 μm to 10 μm.

4. The display substrate according to claim 1, wherein in a case where the orthographic projection of the at least one of the plurality of anodes on the substrate is overlapped with the orthographic projection of the one or more first signal lines on the substrate, in the at least one first signal line whose orthographic projection on the substrate is overlapped with the orthographic projection of the anode, a portion, located outside the orthographic projection of the anode, of an orthographic projection of a first signal line on the substrate is non-overlapped with orthographic projections, on the substrate, of other anodes adjacent to the anode in the plurality of anodes.

5. The display substrate according to claim 1, wherein in a second direction, a distance between two adjacent first signal lines is in a range of 5 μm to 30 μm; wherein the second direction is perpendicular to the first direction.

6. The display substrate according to claim 1, wherein the plurality of first signal lines are the plurality of data lines; and the display substrate further comprises a second conductive layer and a second planarization layer; wherein the second planarization layer is disposed on a side of the first conductive layer away from the first planarization layer;

the second conductive layer is disposed on a side of the second planarization layer away from the first conductive layer; and the second conductive layer includes a plurality of voltage signal lines.

7. The display substrate according to claim 1, wherein the plurality of first signal lines are the plurality of data lines and a plurality of voltage signal lines.

8. The display substrate according to claim 6, wherein each pixel circuit includes a plurality of thin film transistors and at least one capacitor; the plurality of pixel circuits include a plurality of first pixel circuits, a plurality of second pixel circuits and a plurality of third pixel circuits; the plurality of pixel circuits are arranged in a plurality of pixel circuit columns, and the plurality of pixel circuit columns include a plurality of first pixel circuit columns and a plurality of second pixel circuit columns; each first pixel circuit column includes first pixel circuits and second pixel circuits alternately arranged in a column in the first direction, and each second pixel circuit column includes third pixel circuits arranged in a column in the first direction; the plurality of first pixel circuit columns and the plurality of second pixel circuit columns are alternately arranged in a second direction;

the plurality of anodes include a plurality of first anodes, a plurality of second anodes and a plurality of third anodes; the plurality of anodes are arranged in a plurality of anode columns, and the plurality of anode columns include a plurality of first anode columns, a plurality of second anode columns and a plurality of third anode columns;

each first anode column includes first anodes arranged in a column in the first direction, each second anode column includes second anodes arranged in a column in the first direction, and each third anode column includes third anodes arranged in a column in the first direction;

in the second direction, the first anode columns, the second anode columns and the third anode columns are periodically arranged in sequence;

in the first pixel circuit column, each first pixel circuit is electrically connected to a first anode, and each second pixel circuit is electrically connected to a second anode; first anodes corresponding to the first pixel circuit column belong to a first anode column, and second anodes corresponding to the first pixel circuit column belong to a second anode column adjacent to the first anode column; in the second pixel circuit column, each third pixel circuit is electrically connected to a third anode; third anodes corresponding to the second pixel circuit column belong to a same third anode column;

the second direction is perpendicular to the first direction.

9. The display substrate according to claim 8, wherein the plurality of date lines include a plurality of first data lines and a plurality of second data lines; wherein each first data line is electrically connected to first pixel circuits and second pixel circuits in a first pixel circuit column, so that the first data line is electrically connected to first anodes included in a first anode column corresponding to the first pixel circuit column and second anodes included in a second anode column corresponding to the first pixel circuit column; and each second data line is electrically connected to third pixel circuits in a second pixel circuit column, so that the second data line is electrically connected to third anodes included in a third anode column corresponding to the second pixel circuit column.

10. The display substrate according to claim 9, wherein each data line has a plurality of connection portions correspondingly electrically connected to pixel circuits in a pixel circuit column; wherein a connection portion of the first data line correspondingly connected to a second pixel circuit is covered by a second anode to which the second pixel circuit is electrically connected; and two connection portions of the second data line correspondingly connected to two adjacent third pixel circuits are respectively located on two sides of the second data line.

11. The display substrate according to claim 9, wherein in a case where the orthographic projection of the at least one of the plurality of anodes on the substrate is non-overlapped with the orthographic projection of each first signal line on the substrate, a first data line in the plurality of first data lines includes a plurality of straight portions and a plurality of bent portions that are alternately arranged, and is located between a first anode column and a second anode column adjacent to each other; each straight portion extends in the first direction, and each bent portion includes a first segment, a second segment and a third segment connected in sequence; the second segment extends in the first direction, the first segment is connected to a straight portion adjacent to the first segment, and the third segment is connected to another straight portion adjacent to the third segment; an orthographic projection of each straight portion on the substrate is located on a side, in the second direction, of an orthographic projection of a first anode in the first anode column on the substrate, and is located on a side, in the first direction, of an orthographic projection of a second anode in the second anode column on the substrate; an orthographic projection of the second segment of each bent portion on the substrate is located on a side, in the second direction, of the orthographic projection of the second anode in the second anode column on the substrate; and/or a second data line in the plurality of second data lines includes a plurality of straight portions and a plurality of bent portions that are alternately arranged, and is located between a third anode column and a first anode column that are adjacent to each other; each straight portion extends in the first direction, and each bent portion includes a first segment, a second segment and a third segment connected in sequence; the second segment extends in the first direction, the first segment is connected to a straight portion adjacent to the first segment, and the third segment is connected to another straight portion adjacent to the third segment; an orthographic projection of each straight portion on the substrate is located on a side, in the second direction, of an orthographic projection of a first anode in the first anode column on the substrate, and is located on a side, in the first direction, of an orthographic projection of a third anode in the third anode column on the substrate;

an orthographic projection of the second segment of each bent portion on the substrate is located on a side, in the second direction, of the orthographic projection of the third anode in the third anode column on the substrate.

12. The display substrate according to claim 11, wherein in third anodes in the third anode column, every two adjacent third anodes are divided into a group, and in the first direction, a distance between two third anodes in each group of third anodes is less than a distance between an entirety of the two third anodes and other surrounding third anode;

the orthographic projection of each straight portion on the substrate is located on a side, in the first direction, of an orthographic projection of a group of third anodes in the third anode column on the substrate; and the orthographic projection of the second segment of each bent portion on the substrate is located on a side, in the second direction, of the orthographic projection of the group of third anodes on the substrate.

13. The display substrate according to claim 9, wherein in a case where the at least one first signal line includes the single first signal line, and the orthographic projection of the anode is overlapped with the orthographic projection of the first signal line on the substrate, the first signal line is a first data line in the plurality of first data lines;

center lines, in the first direction, of orthographic projections of second anodes in a second anode column on the substrate each coincide with a respective portion of an orthographic projection of the first data line on the substrate.

14. The display substrate according to claim 9, wherein in a case where the at least one first signal line includes two first signal lines, and the orthographic projection of the anode is overlapped with orthographic projections of the two first signal lines on the substrate, the two first signal lines are respectively a first data line and a second data line corresponding to a first anode column, a second column and a third column that are adjacent;

wherein orthographic projections of the first data line and the second data line on the substrate are each overlapped with orthographic projections of third anodes included in the third anode column on the substrate, and portions of each third anode that the first data line and the second data line respectively cross are symmetrical about a center line of the third anode in the first direction.

15. The display substrate according to claim 14, wherein the orthographic projection of the second data line is non-overlapped with orthographic projections of first anodes adjacent to the second data line on the substrate; and the orthographic projection of the first data line is non-overlapped with orthographic projections of second anodes adjacent to the first data line on the substrate; or the orthographic projection of the first data line is overlapped with orthographic projections, on the substrate, of second anodes in a second anode column that is adjacent to the first data line, and overlapping portions of the orthographic projection of the first data line respectively coincide with center lines, in the first direction, of the orthographic projections of the second anodes in the second anode column on the substrate.

16. The display substrate according to claim 9, further comprising:

a buffer layer disposed on the substrate;

a semiconductor layer disposed on a side of the buffer layer away from the substrate and including a plurality of semiconductor patterns; wherein each semiconductor pattern includes active layers of the plurality of thin film transistors in the pixel circuit;

a gate insulating layer disposed on a side of the semiconductor layer away from the substrate;

a first gate metal layer disposed on a side of the gate insulating layer away from the substrate;

wherein the first gate metal layer includes a plurality of first patterns, and each first pattern is a first electrode plate of a capacitor in the pixel circuit;

a first insulating layer disposed on a side of the first gate metal layer away from the substrate;

a second gate metal layer disposed on a side of the first insulating layer away from the substrate; wherein the second gate metal layer includes a plurality of second patterns, and each second pattern is a second electrode plate of the capacitor in the pixel circuit;

a second insulating layer disposed on a side of the second gate metal layer away from the substrate;

a pixel defining layer disposed on a side of the plurality of anodes and the first planarization layer away from the substrate; wherein the pixel defining layer defines a plurality of openings, and each opening exposes at least a portion of an anode in the plurality of anodes;

a plurality of light-emitting functional layers disposed on a side of the plurality of anodes away from the substrate; wherein each light-emitting functional layer is located in an opening in the plurality of openings; and a cathode layer disposed on a side of the light-emitting functional layers away from the substrate; wherein the cathode layer extends to a side of the pixel defining layer away from the substrate, and covers the pixel defining layer.

17. The display substrate according to claim 16, wherein each pixel circuit includes at least a compensation transistor, a driving transistor and the capacitor; wherein an active layer of the compensation transistor includes a first electrode region, a second electrode region and a channel region connecting the first electrode region and the second electrode region;

an active layer of the driving transistor includes a first electrode region, a second electrode region and a channel region connecting the first electrode region and the second electrode region;

a portion of the first electrode plate of the capacitor whose orthographic projection on the substrate is overlapped with an orthographic projection of the channel region of the driving transistor on the substrate serves as a gate of the driving transistor;

the first electrode region of the compensation transistor is electrically connected to the second electrode region of the driving transistor; the second conductive layer further includes a plurality of connection structures, and the second electrode region of the compensation transistor is electrically connected to the gate of the driving transistor through a connection structure in the plurality of connection structures; and an orthographic projection of each second anode on the substrate is overlapped with orthographic projections of connection structures in two adjacent pixel circuits on the substrate;

and one of the two adjacent pixel circuits is a second pixel circuit electrically connected to the second anode, and another one of the two adjacent pixel circuits is a third pixel circuit adjacent to the second pixel circuit.

18. The display substrate according to claim 17, wherein an orthographic projection of each data line on the substrate is overlapped with orthographic projections, on the substrate, of second electrode plates of capacitors in pixel circuits in a pixel circuit column to which the data line is electrically connected.

19. A display apparatus, comprising the display substrate according to claim 1.

* * * * *